US012439596B2

(12) United States Patent
Maruyama et al.

(10) Patent No.: US 12,439,596 B2
(45) Date of Patent: Oct. 7, 2025

(54) SEMICONDUCTOR MEMORY DEVICE FOR SUPPRESSING VARIATIONS OF IMPURITY CONCENTRATIONS

(71) Applicant: KIOXIA CORPORATION, Tokyo (JP)

(72) Inventors: Takayuki Maruyama, Yokkaichi (JP); Yoshiaki Fukuzumi, Yokkaichi (JP); Yuki Sugiura, Yokkaichi (JP); Shinya Arai, Yokkaichi (JP); Fumie Kikushima, Yokkaichi (JP); Keisuke Suda, Yokkaichi (JP); Takashi Ishida, Yokkaichi (JP)

(73) Assignee: KIOXIA CORPORATION, Tokyo (JP)

( * ) Notice: Subject to any disclaimer, the term of this patent is extended or adjusted under 35 U.S.C. 154(b) by 517 days.

(21) Appl. No.: 17/559,786

(22) Filed: Dec. 22, 2021

(65) Prior Publication Data

US 2022/0115403 A1 Apr. 14, 2022

Related U.S. Application Data

(63) Continuation of application No. 16/296,276, filed on Mar. 8, 2019, now abandoned.

(30) Foreign Application Priority Data

May 15, 2018 (JP) .................................. 2018-093926

(51) Int. Cl.
*H10B 43/27* (2023.01)
*H01L 21/768* (2006.01)
(Continued)

(52) U.S. Cl.
CPC ....... *H10B 43/27* (2023.02); *H01L 21/76834* (2013.01); *H10B 41/10* (2023.02);
(Continued)

(58) Field of Classification Search
None
See application file for complete search history.

(56) References Cited

U.S. PATENT DOCUMENTS

| 7,847,334 B2 | 12/2010 | Katsumata et al. |
| 9,431,419 B2 | 8/2016 | Fukuzumi et al. |
| (Continued) | | |

FOREIGN PATENT DOCUMENTS

| JP | 2018-142654 | 9/2018 |
| TW | 201739007 A | 11/2017 |

*Primary Examiner* — Grant S Withers
(74) *Attorney, Agent, or Firm* — Oblon, McClelland, Maier & Neustadt, L.L.P.

(57) ABSTRACT

A semiconductor memory device includes a plurality of electrode layers stacked above a first semiconductor layer, a second semiconductor layer and a first film. The second semiconductor layer extends through the plurality of electrode layers in a stacking direction of the plurality of electrode layers. The second semiconductor layer includes an end portion inside the first semiconductor layer. The first film is positioned inside the first semiconductor layer and contacts the first semiconductor layer. The first semiconductor layer includes a first portion, a second portion, and a third portion. The first film is positioned between the first portion and the second portion. The third portion links the first portion and the second portion. The third portion is positioned between the first film and the second semiconductor layer. The second semiconductor layer includes a contact portion contacting the third portion of the first semiconductor layer.

13 Claims, 21 Drawing Sheets

(51) Int. Cl.
    *H10B 41/10*          (2023.01)
    *H10B 41/27*          (2023.01)
    *H10B 43/10*          (2023.01)
    *H01L 21/02*          (2006.01)

(52) U.S. Cl.
    CPC ............ *H10B 41/27* (2023.02); *H10B 43/10* (2023.02); *H01L 21/02164* (2013.01); *H01L 21/02238* (2013.01); *H01L 21/02255* (2013.01); *H01L 21/02271* (2013.01)

(56) References Cited

U.S. PATENT DOCUMENTS

| | | | |
|---|---|---|---|
| 9,455,263 B2 | 9/2016 | Zhang et al. | |
| 9,524,977 B2 | 12/2016 | Sharangpani et al. | |
| 9,524,979 B2 | 12/2016 | Arai | |
| 9,536,970 B2 | 1/2017 | Seol et al. | |
| 2016/0071881 A1* | 3/2016 | Lee | H01L 29/7827 |
| | | | 257/329 |
| 2016/0190147 A1 | 6/2016 | Kato et al. | |
| 2016/0268263 A1 | 9/2016 | Lee | |
| 2017/0025428 A1 | 1/2017 | Lai et al. | |
| 2017/0207226 A1* | 7/2017 | Lee | H10B 43/27 |
| 2017/0309638 A1 | 10/2017 | Nagumo | |
| 2018/0323213 A1 | 11/2018 | Arai | |
| 2019/0067312 A1 | 2/2019 | Arisumi | |
| 2019/0288000 A1* | 9/2019 | Choi | H01L 29/0649 |
| 2019/0295956 A1 | 9/2019 | Kawai | |
| 2019/0296046 A1 | 9/2019 | Arai | |
| 2019/0333922 A1* | 10/2019 | Jung | H10B 41/27 |
| 2019/0333931 A1* | 10/2019 | Jung | H10B 41/27 |
| 2019/0393238 A1 | 12/2019 | Lim | |
| 2020/0235125 A1 | 7/2020 | Ara | |
| 2021/0202523 A1 | 7/2021 | Arai | |

* cited by examiner

SEMICONDUCTOR MEMORY DEVICE FOR SUPPRESSING VARIATIONS OF IMPURITY CONCENTRATIONS

CROSS-REFERENCE TO RELATED APPLICATIONS

This application is a continuation of U.S. application Ser. No. 16/296,276, filed Mar. 8, 2019, the entire contents of which are incorporated herein by reference. U.S. application Ser. No. 16/296,276 is based upon and claims the benefit of priority from Japanese Patent Application No. 2018-093926, filed on May 15, 2018; the entire contents of which are incorporated herein by reference.

FIELD

Embodiments relate to a semiconductor memory device.

BACKGROUND

There is a semiconductor memory device that includes three-dimensionally arranged memory cells. For example, a NAND memory device includes a semiconductor channel extending through multiple word lines in the stacking direction of the multiple word lines. Although such a semiconductor channel is connected to a semiconductor layer disposed below the multiple word lines, the connection is not easy.

DETAILED DESCRIPTION

Figure 1:
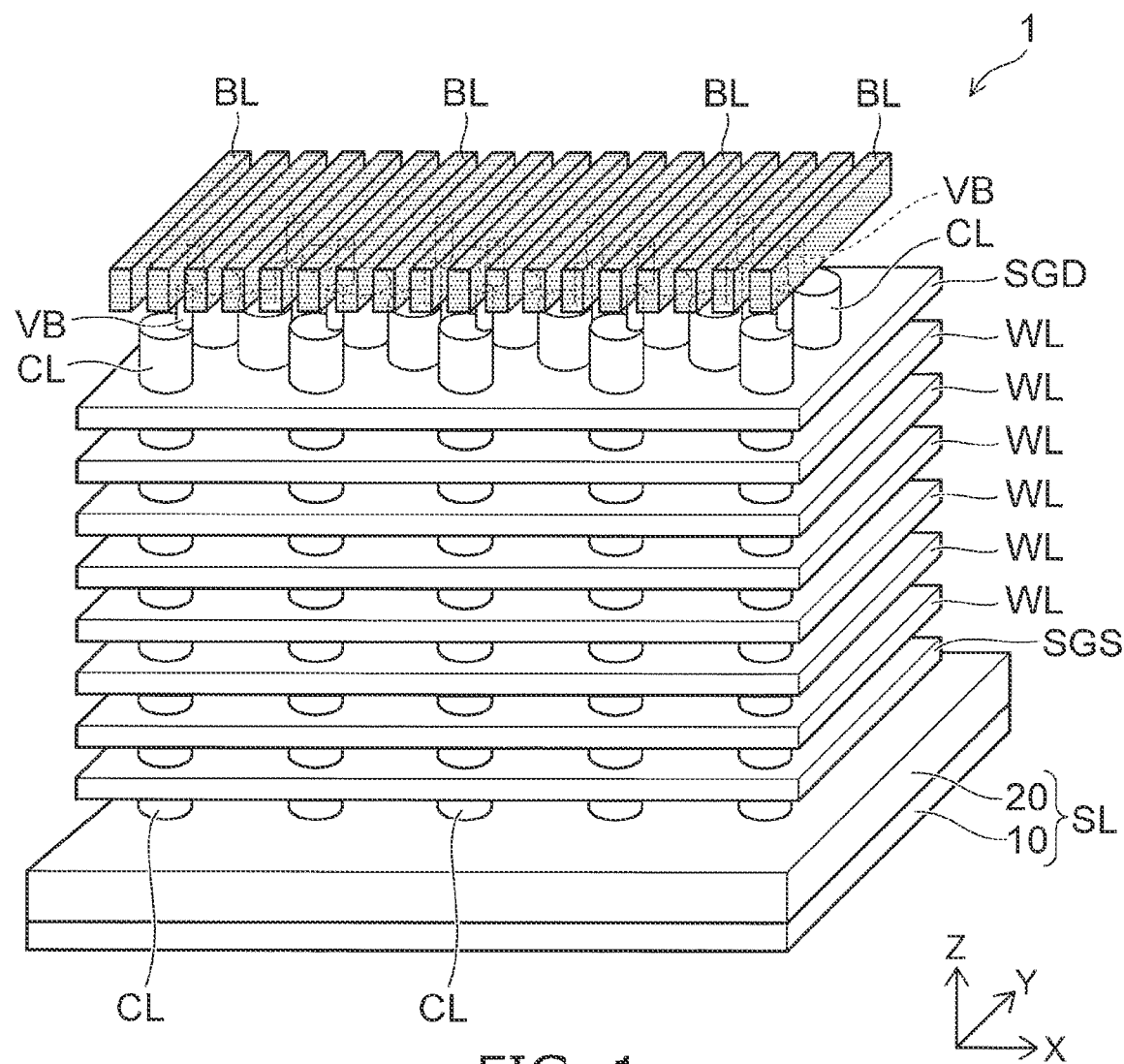
FIG. 1 is a perspective view schematically showing a semiconductor memory device according to a first embodiment.

According to an embodiment, a semiconductor memory device includes a plurality of electrode layers stacked above a first semiconductor layer, a second semiconductor layer and a first film. The second semiconductor layer extends through the plurality of electrode layers in a stacking direction of the plurality of electrode layers. The second semiconductor layer includes an end portion inside the first semiconductor layer. The first film is positioned inside the first semiconductor layer and contacts the first semiconductor layer. The first semiconductor layer includes a first portion, a second portion, and a third portion. The first film is positioned between the first portion and the second portion. The third portion links the first portion and the second portion. The third portion is positioned between the first film and the second semiconductor layer. The second semiconductor layer includes a contact portion contacting the third portion of the first semiconductor layer.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

First Embodiment

FIG. 1 is a perspective view schematically showing a semiconductor memory device 1 according to a first embodiment. In FIG. 1, insulating films are not illustrated to show the configuration of the semiconductor memory device 1.

The semiconductor memory device 1 includes a source layer SL and multiple electrode layers. The multiple electrode layers (hereinbelow, word lines WL, select gates SGS and SGD) are stacked above the source layer SL with inter-layer insulating films interposed (not-illustrated).

The semiconductor memory device 1 further includes columnar bodies CL and bit lines BL. The columnar bodies CL extend through the select gate SGS, the multiple word lines WL, and the select gate SGD in the stacking direction (the Z-direction). The bit lines BL are provided above the select gate SGD. The columnar bodies CL are connected to the bit lines BL via connection plugs VB. The columnar bodies CL are connected to the source layer SL at the lower ends of the columnar bodies CL.

The source layer SL is provided on a substrate (not-illustrated), e.g., a silicon substrate with an insulating film interposed. The source layer SL includes, for example, a metal layer 10 and a semiconductor layer 20. The semiconductor layer 20 is, for example, a silicon layer and is provided on the metal layer 10. The metal layer 10 includes, for example, tungsten (W).

Figure 2A:
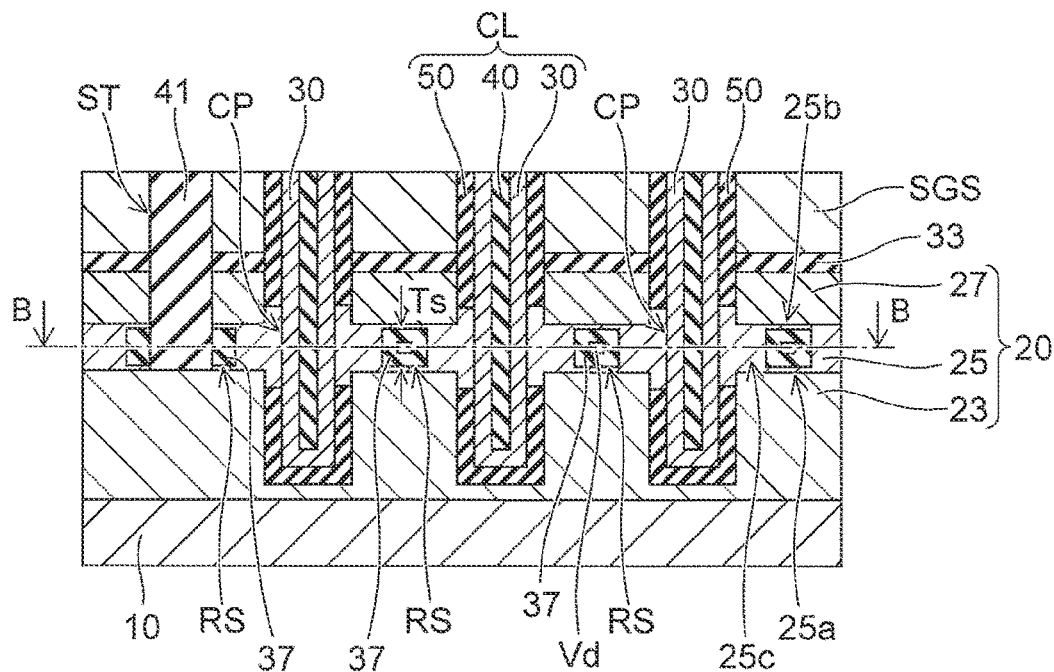
FIGS. 2A and 2B are schematic cross-sectional views showing the semiconductor memory device according to the first embodiment.
Figure 2B:
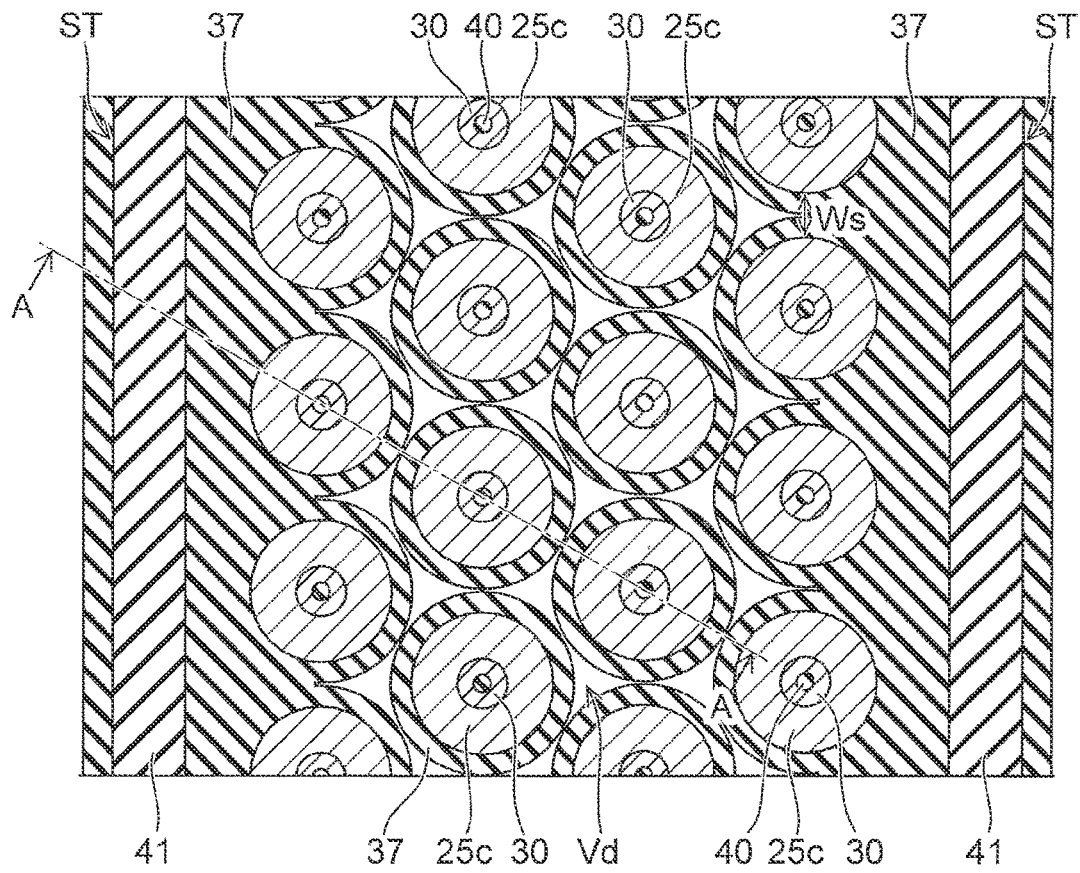

FIGS. 2A and 2B are schematic cross-sectional views showing the semiconductor memory device 1 according to the first embodiment. FIG. 2A is a cross-sectional view along line A-A shown in FIG. 2B. FIG. 2B is a cross-sectional view along line B-B shown in FIG. 2A.

As shown in FIG. 2A, the semiconductor layer 20 that is provided on the metal layer 10 includes a first layer 23, a second layer 25, and a third layer 27. The first layer 23 and the third layer 27 are, for example, polysilicon layers. The second layer 25 is, for example, a polysilicon layer or a single-crystal silicon layer. For example, the second layer 25 has a residual space RS in the interior of the second layer 25.

An insulating film 37 is provided to cover the inner surface of the residual space RS. The insulating film 37 is, for example, a silicon oxide film. In the example, the insulating film 37 is provided so that a void Vd remains in the interior of the insulating film 37.

The select gate SGS is provided on the semiconductor layer 20 with an insulating film 33 interposed. The columnar bodies CL extend through the select gate SGS and the insulating film 33 and extend into the semiconductor layer 20.

As shown in FIG. 2A, the lower ends of the columnar bodies CL are positioned inside the first layer 23. A slit ST that defines the outer edges of the select gate SGS, the word lines WL (not-illustrated), and the select gate SGD (not-illustrated) also is provided. The slit ST has a depth capable of reaching a level same as a level in the Z-direction of the second layer 25. An insulating film 41 also is provided with which the interior of the slit ST is filled.

The columnar body CL includes a semiconductor layer 30, an insulating core 40, and a memory film 50. The insulating core 40 is, for example, silicon oxide and extends in the Z-direction. The semiconductor layer 30 is, for example, a non-doped polysilicon layer and is provided to cover the insulating core 40. The memory film 50 is included in the outer shell of the columnar body CL and is provided to cover the semiconductor layer 30. The memory film 50 is selectively removed at a level same as a level in the Z-direction of the second layer 25.

The second layer 25 includes, for example, a first portion 25a, a second portion 25b, and a third portion 25c. The first portion 25a is provided on the first layer 23; and the second portion 25b is provided on the lower surface of the third layer 27. The third portion 25c is provided on a contact portion CP of the semiconductor layer 30. The contact portion CP is a portion exposed by selectively removing the memory film 50. The third portion 25c is provided to contact the first portion 25a and the second portion 25b. The residual space RS that is inside the second layer 25 is surrounded with the first portion 25a, the second portion 25b, and the third portion 25c.

As shown in FIG. 2A, the thicknesses in the X-direction and the Y-direction of the third portion 25c are thicker than the thicknesses in the Z-direction of the first portion 25a and the second portion 25b. The third portion 25c links the first portion 25a and the second portion 25b; and the second layer 25 is formed as one body. Also, the second layer 25 is connected to the contact portion CP of the semiconductor layer 30 via the third portion 25c. In other words, the semiconductor layer 20 is connected to the semiconductor layer 30 via the third portion 25c.

As shown in FIG. 2B, the third portion 25c of the second layer 25 is provided around the semiconductor layer 30. Further, the insulating film 37 is provided around the third portion 25c. For example, the insulating film 37, the third portion 25c, and the semiconductor layer 30 are provided in a concentric circular configuration having the insulating core 40 as the center. The semiconductor layer 30 is provided to be separated from the insulating film 37 with the third portion 25c interposed.

For example, the second layer 25 is provided so that a distance $W_S$ between the adjacent third portions 25c is narrower than a height $T_S$ in the Z-direction of the residual space RS (referring to FIG. 2A). Therefore, a void Vd remains in the interior of the second layer 25 when the insulating film 37 plugs the space between the adjacent third portions 25c. On the other hand, the residual space RS between the slit ST and the second layer 25 is filled with the insulating film 37 (referring to FIG. 8A).

Although the insulating film 37 and the insulating film 41 filling the slit ST are illustrated discriminately in FIGS. 2A and 2B, for example, the insulating film 37 and the insulating film 41 may be formed as one body in the case where the insulating film 41 is a silicon oxide film.

Figure 3A:
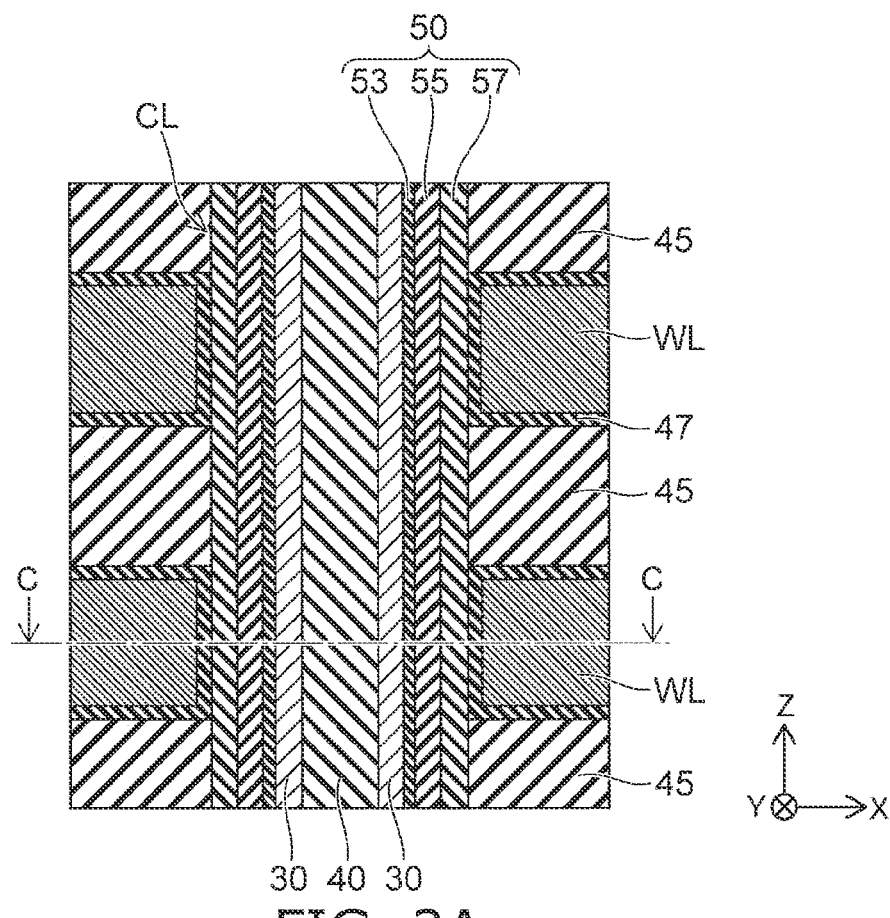
FIGS. 3A and 3B are schematic cross-sectional views showing memory cells of the semiconductor memory device according to the first embodiment.
Figure 3B:
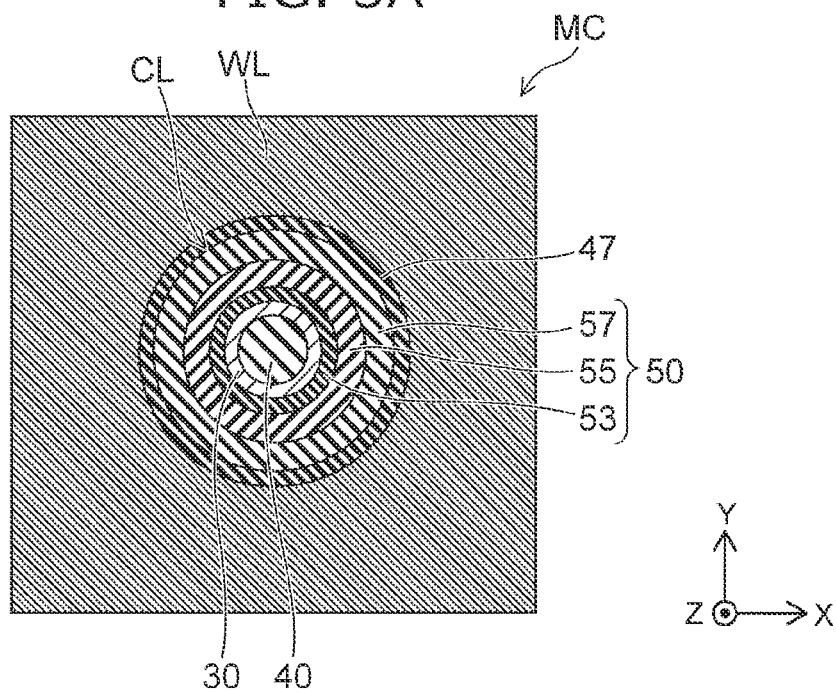

FIGS. 3A and 3B are schematic cross-sectional views showing memory cells MC of the semiconductor memory device 1 according to the first embodiment. FIG. 3B is a schematic view showing a cross section along line C-C shown in FIG. 3A.

As shown in FIG. 3A, the columnar body CL extends in the Z-direction through the word lines WL. Insulating films 45 are provided between the word lines WL stacked in the Z-direction. The insulating films 45 are, for example, silicon oxide films. An insulating film 47 is provided between the columnar body CL and the word line WL and between the word line WL and the insulating films 45. The insulating film 47 includes, for example, a metal oxide such as aluminum oxide, etc.

The columnar body CL includes the insulating core 40 extending in the Z-direction. The semiconductor layer 30 and the memory film 50 are positioned between the insulating core 40 and the word lines WL. The memory film 50 includes a first insulating film 53, a second insulating film 55, and a third insulating film 57. The first insulating film 53 and the third insulating film 57 are, for example, silicon oxide films. The second insulating film 55 is, for example, a silicon nitride film.

As shown in FIG. 3B, the columnar body CL has, for example, a substantially circular configuration in the cross section along the X-Y plane. The semiconductor layer 30 is provided to surround the insulating core 40. The memory film 50 is provided to surround the semiconductor layer 30. In a cross section including the word line WL, the insulating film 47 is provided to surround the memory film 50.

The memory cells MC are provided at the portions where the columnar body CL and the word lines WL cross. The semiconductor layer 30 functions as the channels of the memory cells MC. The word lines WL function as the control gates of the memory cells MC. The memory film 50 functions as the memory portions of the memory cells MC at the portions positioned between the semiconductor layer 30 and the word lines WL.

For example, the second insulating film 55 functions as a charge storage film that stores charge in portions positioned between the semiconductor layer 30 and the word lines WL. The first insulating film 53 is positioned between the semiconductor layer 30 and the second insulating film 55 and functions as, for example, a tunneling insulating film. The insulating films 47 and the third insulating film 57 are positioned between the second insulating film 55 and the word lines WL. The insulating films 47 and the third insulating film 57 function as, for example, blocking insulating films.

The embodiment is not limited to the example; for example, the memory cells MC may have floating gate structures. Specifically, conductive floating gates that are positioned between the semiconductor layer 30 and the word lines WL are disposed instead of the charge storage film. The floating gates are provided to surround the semiconductor layer 30 and are arranged to be separated from each other along the extension direction of the semiconductor layer 30

(the Z-direction). The memory cell MC includes a tunneling insulating film positioned between the floating gate and the semiconductor layer 30, and a blocking insulating film positioned between the floating gate and a word line WL. In such a case, the tunneling insulating film may extend in the Z-direction along the semiconductor layer 30 as does the first insulating film 53; and the blocking insulating films may be arranged to be separated from each other between the floating gates and the word lines WL.

A method for manufacturing the semiconductor memory device 1 will now be described with reference to FIG. 4A to FIG. 10B. FIG. 4A to FIG. 10B are schematic cross-sectional views sequentially showing the manufacturing processes of the semiconductor memory device 1.

Figure 4A:
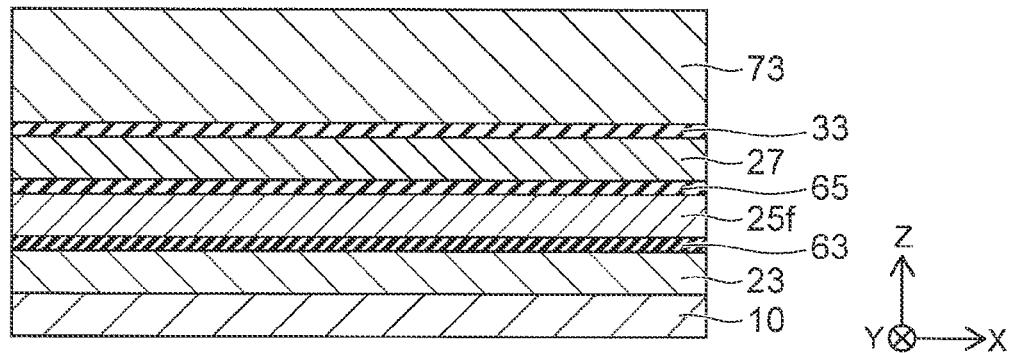
FIGS. 4A to 10B are schematic cross-sectional views showing the manufacturing processes of the semiconductor memory device according to the first embodiment.

As shown in FIG. 4A, the first layer 23, a sacrificial layer 25f, the third layer 27, and a semiconductor layer 73 are stacked in order on the metal layer 10. An intermediate film 63 is formed between the first layer 23 and the sacrificial layer 25f; and an intermediate film 65 is formed between the sacrificial layer 25f and the third layer 27. Also, the insulating film 33 is formed between the third layer 27 and the semiconductor layer 73.

The first layer 23 and the third layer 27 are, for example, polysilicon layers. The sacrificial layer 25f is, for example, a polysilicon layer and preferably is a non-doped polysilicon layer not doped with impurities. The semiconductor layer 73 is, for example, a conductive polysilicon layer having a low resistance.

The intermediate films 63 and 65 include a material having resistance to the etching conditions of the sacrificial layer 25f and include a material that can be removed selectively with respect to the first layer 23 and the third layer 27. The intermediate films 63 and 65 are, for example, silicon oxide films.

Figure 4B:
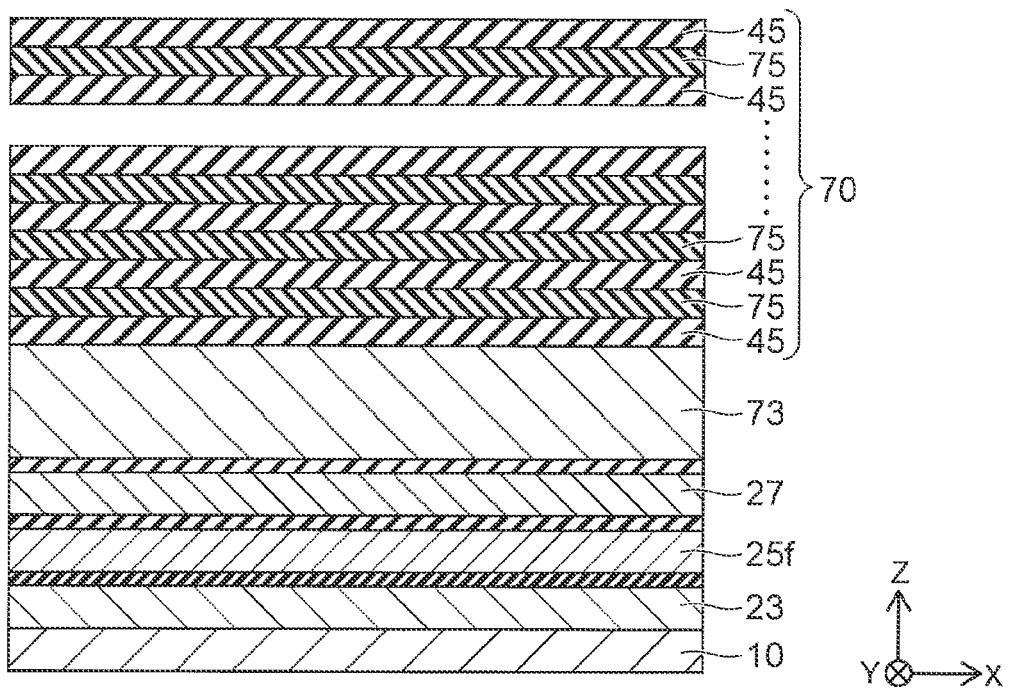

As shown in FIG. 4B, a stacked body 70 that includes the multiple insulating films 45 and multiple sacrificial films 75 is formed on the semiconductor layer 73. The insulating films 45 and the sacrificial films 75 are stacked alternately in the Z-direction. The insulating films 45 are, for example, silicon oxide films; and the sacrificial films 75 are, for example, silicon nitride films.

Figure 5A:
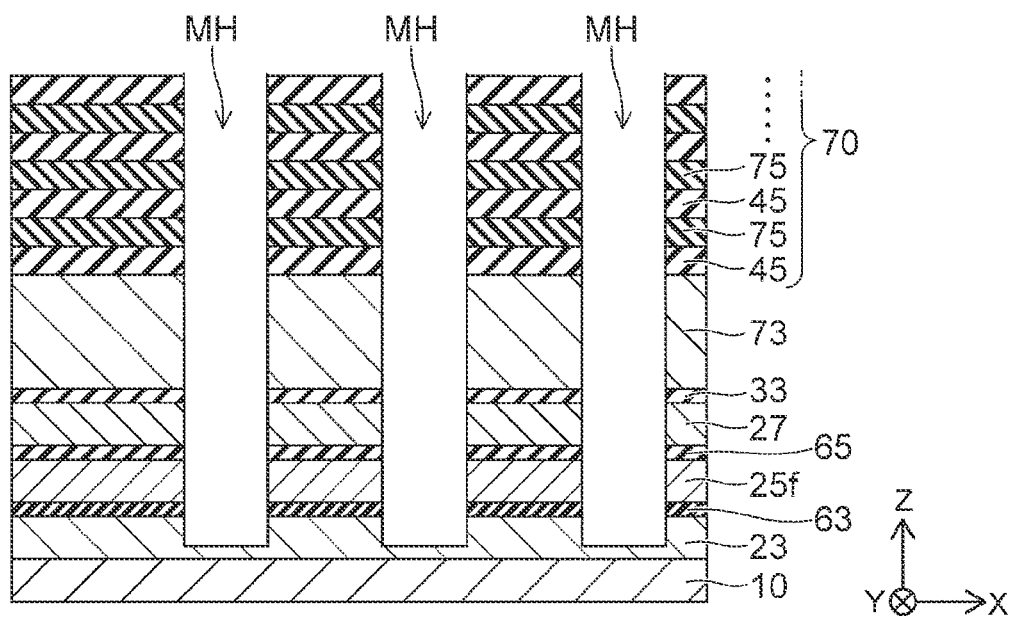

As shown in FIG. 5A, memory holes MH are formed with depths capable of reaching the first layer 23 from the upper surface of the stacked body 70. For example, the memory holes MH are formed to depths reaching the semiconductor layer 73 by selectively removing the stacked body 70 using anisotropic RIE (Reactive Ion Etching). Subsequently, the memory holes MH are formed to depths reaching the first layer 23 by sequentially removing the semiconductor layer 73, the insulating film 33, the third layer 27, the intermediate film 65, the sacrificial layer 25f, and the intermediate film 63. The semiconductor layer 73 serves as a so-called etching stopper.

Figure 5B:
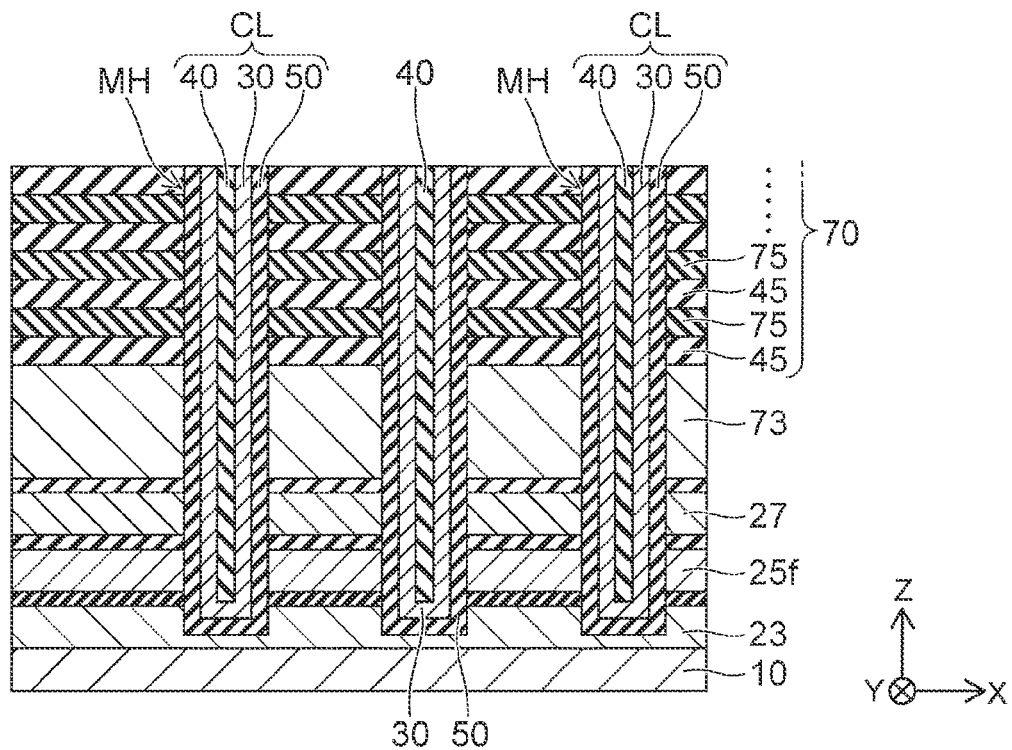

As shown in FIG. 5B, the columnar bodies CL are formed in the interiors of the memory holes MH. Specifically, the memory film 50 that covers the inner surfaces of the memory holes MH is formed; subsequently, the semiconductor layer 30 is formed on the memory film 50. Then, the insulating core 40 is formed, which fills the interiors of the memory holes MH. The semiconductor layer 30 is, for example, a non-doped polysilicon layer formed using CVD (Chemical Vapor Deposition) under the condition without adding impurities intentionally.

Figure 6A:
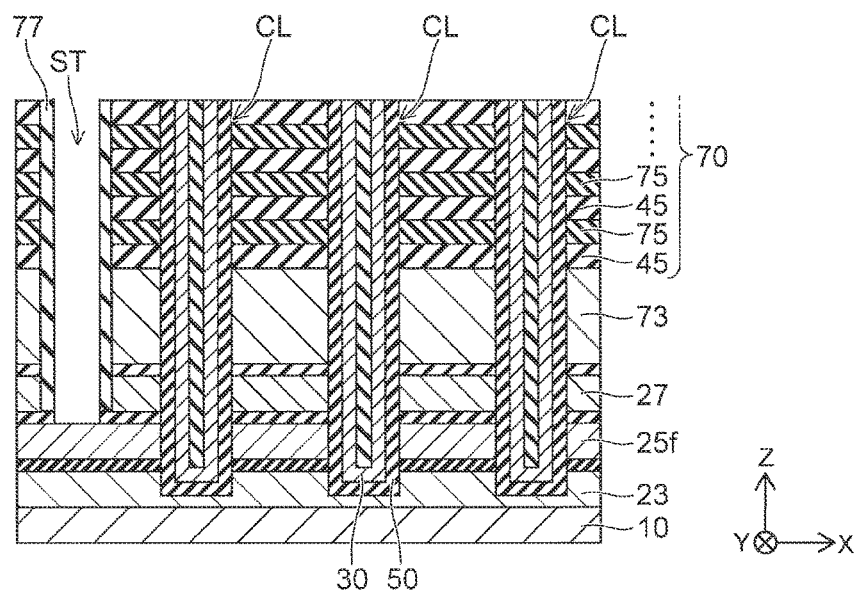

As shown in FIG. 6A, the slit ST is formed, which has a depth capable of reaching the sacrificial layer 25f from the upper surface of the stacked body 70. The slit ST is formed to define the outer edges of the portions that are to be the word lines WL and the select gate SGD in the stacked body 70 and the outer edge of the portion that is to be the select gate SGS in the semiconductor layer 73. Subsequently, an insulating film 77 is formed, which covers the inner wall of the slit ST. The insulating film 77 is formed through the steps, for example, of forming the insulating film 77 to cover the inner surface of the slit ST and then, selectively removing the portion of the insulating film 77 using anisotropic RIE that is formed on the bottom surface of the slit ST. The insulating film 77 is, for example, a silicon nitride film. A portion of the sacrificial layer 25f is exposed at the bottom surface of the slit ST.

Figure 6B:
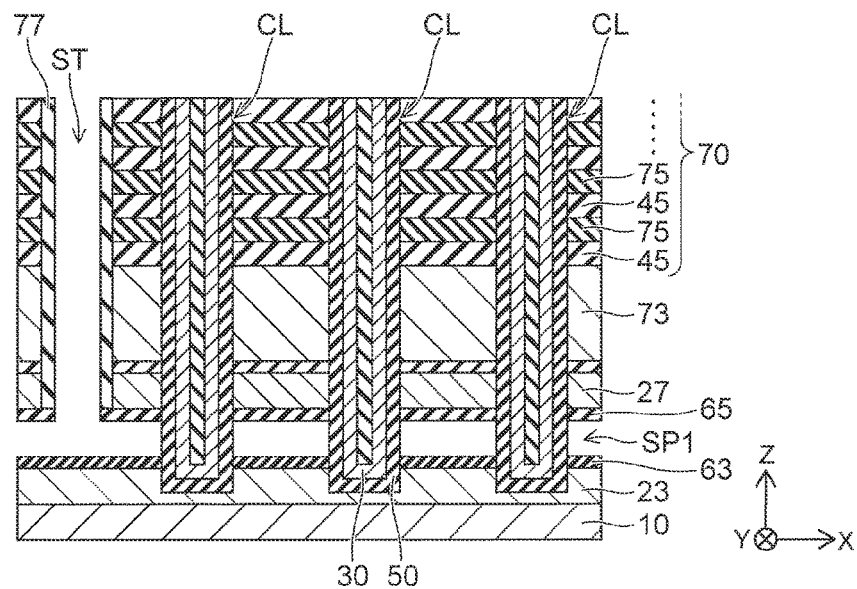

As shown in FIG. 6B, a space SP1 is formed between the intermediate film 63 and the intermediate film 65. For example, the space SP1 is formed by selectively removing the sacrificial layer 25f using etchant supplied via the slit ST. The columnar bodies CL support the structure body higher than the intermediate film 65 and maintain the space SP1.

Figure 7A:
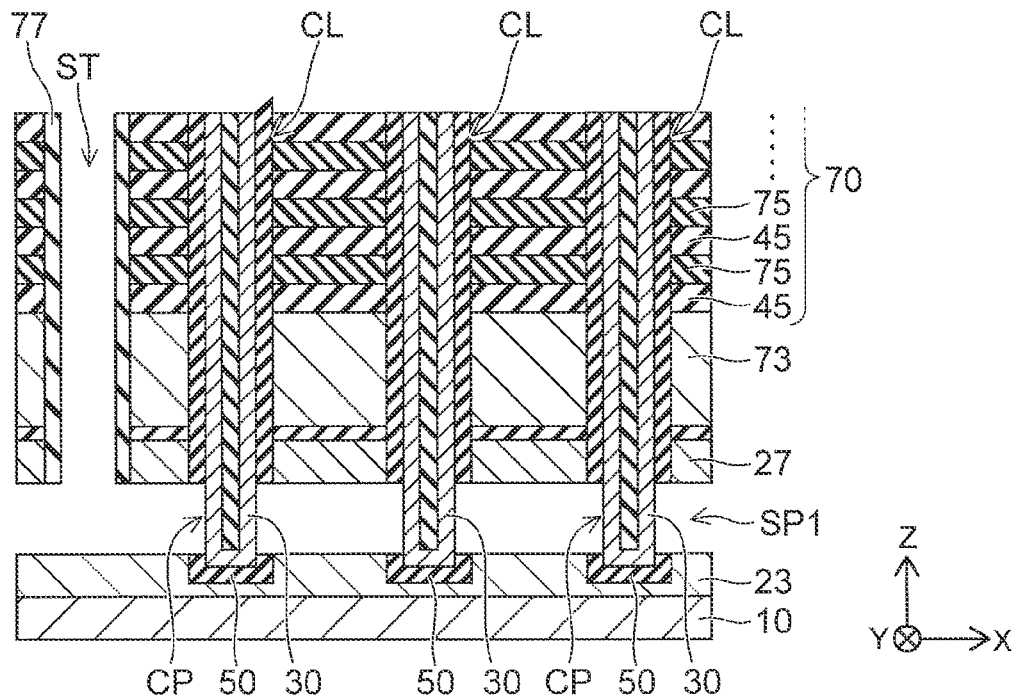

As shown in FIG. 7A, the first layer 23, the third layer 27, and portions of the semiconductor layers 30 are exposed at the inner surface of the space SP1 by removing the intermediate films 63, 65 and portions of the memory films 50. For example, the intermediate films 63 and 65 and the memory films 50 are selectively removed using an etchant supplied via the slit ST.

Figure 7B:
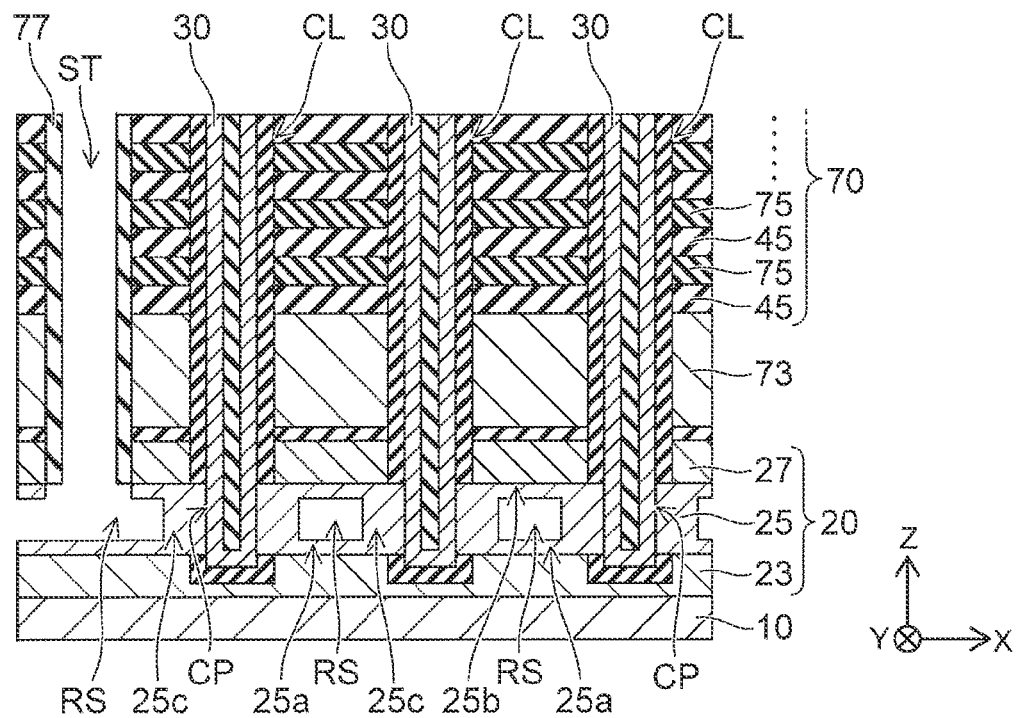

As shown in FIG. 7B, the second layer 25 is formed on the inner surface of the space SP1. The second layer 25 is, for example, a silicon layer. The second layer 25 is formed selectively on the surfaces of the first layer 23, the third layer 27, and the contact portions CP of the semiconductor layers 30. The second layer 25 is, for example, a silicon layer that is epitaxially grown. Also, the second layer 25 may be a polysilicon layer deposited by CVD.

For example, the first layer 23 and the third layer 27 include at least one of phosphorus (P), boron (B), or carbon (C) as an impurity. The semiconductor layers 30 are, for example, non-doped polysilicon layers. In such a case, the silicon layer formed on the first layer 23 and the third layer 27 has a growth rate slower than a growth rate of the silicon layer formed on the semiconductor layers 30. Therefore, the first portion 25a of the second layer 25 formed on the first layer 23 and the second portion 25b of the second layer 25 formed on the third layer 27 have thicknesses in the Z-direction thinner than the thicknesses in the X-direction and the Y-direction of the third portion 25c formed on the contact portions CP of the semiconductor layers 30. Thereby, the adjacent third portions 25c (referring to FIG. 2B) has the distance $W_S$ therebetween that can be set to be narrower than the height $T_S$ in the Z-direction of the residual space RS remaining in the interior of the second layer 25 (referring to FIG. 2A).

Figure 8A:
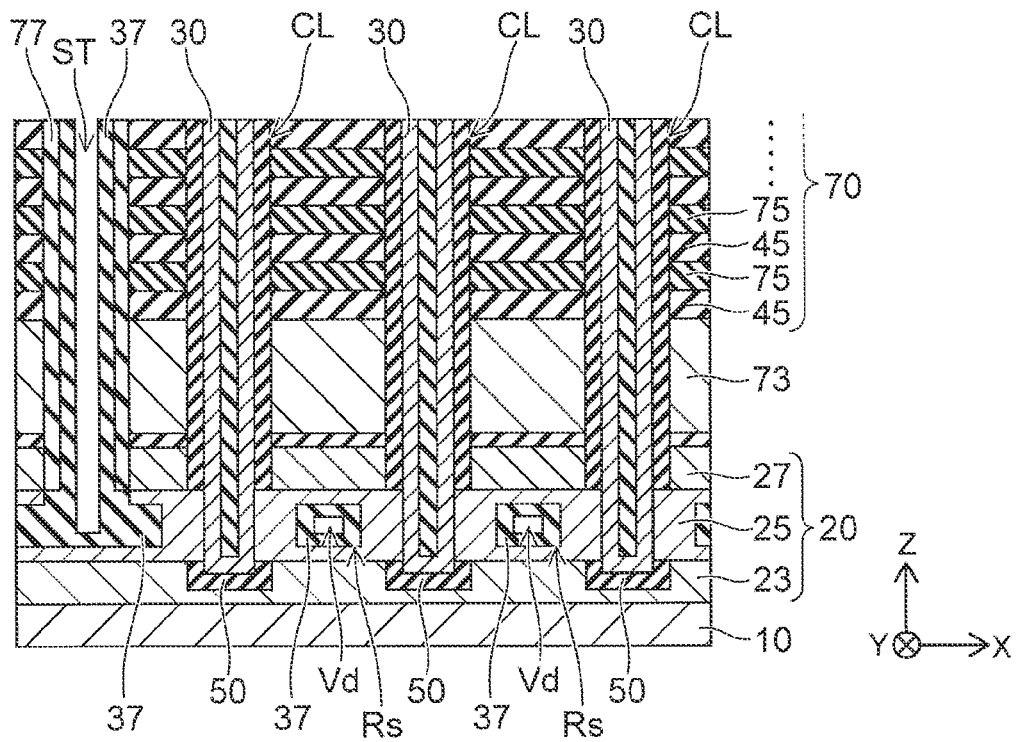

As shown in FIG. 8A, the insulating film 37 is formed on the inner surface of the residual space RS. The insulating film 37 is, for example, a silicon oxide film. For example, the insulating film 37 is formed using thermal oxidation of the second layer 25 or CVD. In such a case, the void Vd may remain in the interior of the insulating film 37, because the space between the adjacent third portions 25c is plugged. Also, the insulating film 37 is formed to have a thickness such that a space remains in the interior of the slit ST.

Figure 8B:
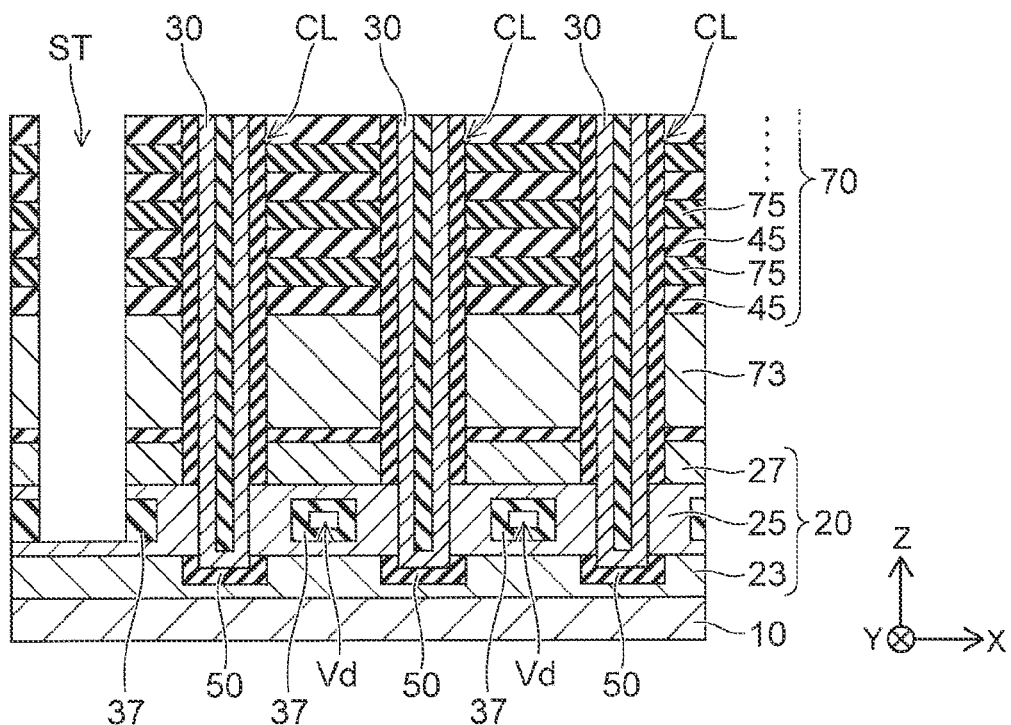

As shown in FIG. 8B, the insulating film 37 and the insulating film 77 are removed, which are in the interior of the slit ST. For example, the insulating film 37 and the insulating film 77 are removed using isotropic dry etching or wet etching.

Figure 9A:
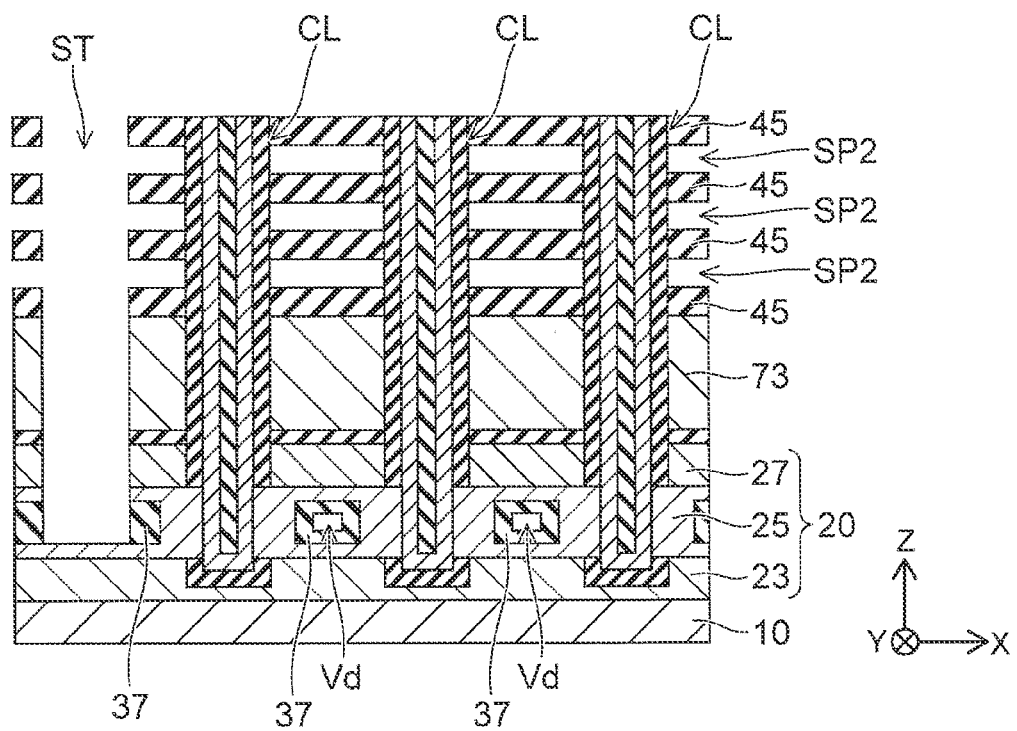

As shown in FIG. 9A, spaces SP2 are formed between the insulating films 45 adjacent to each other in the Z-direction.

For example, the spaces SP2 are formed by selectively removing the sacrificial films 75 (referring to FIG. 4B) by supplying an etchant via the slit ST.

Figure 9B:
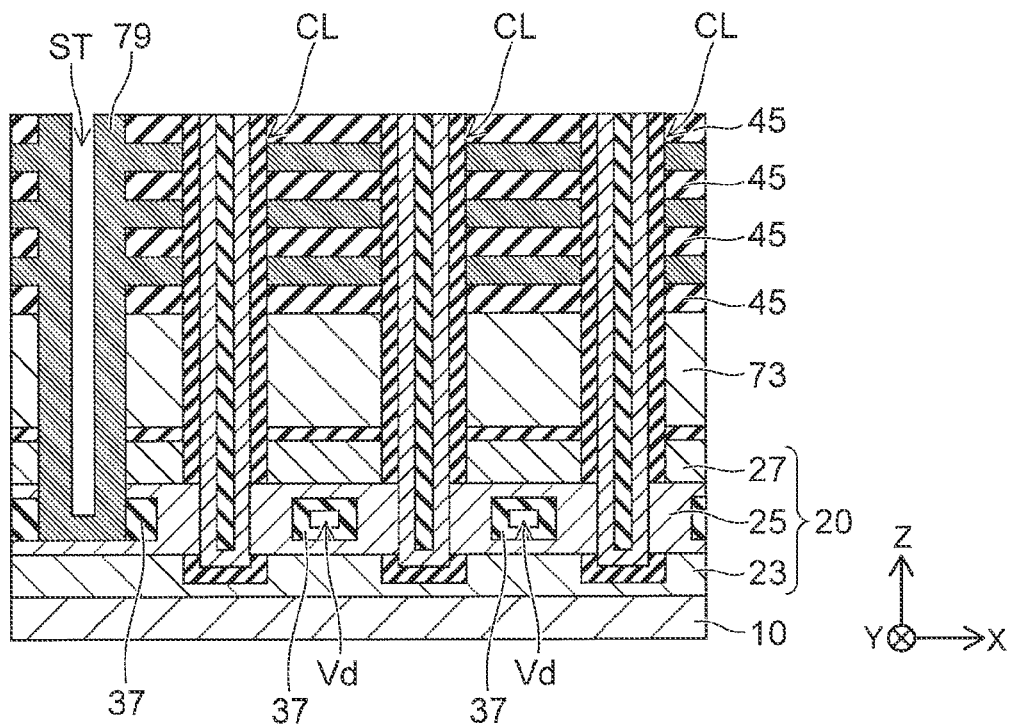

As shown in FIG. 9B, a metal layer 79 is formed to fill the spaces SP2. The metal layer 79 is, for example, a tungsten layer formed using CVD. The insulating film 47 is not illustrated in FIG. 9B and the following drawings. The insulating film 47 is formed to cover the inner surfaces of the spaces SP2 before forming the metal layer 79. The insulating film 47 is, for example, an insulative metal oxide film formed using CVD.

Figure 10A:
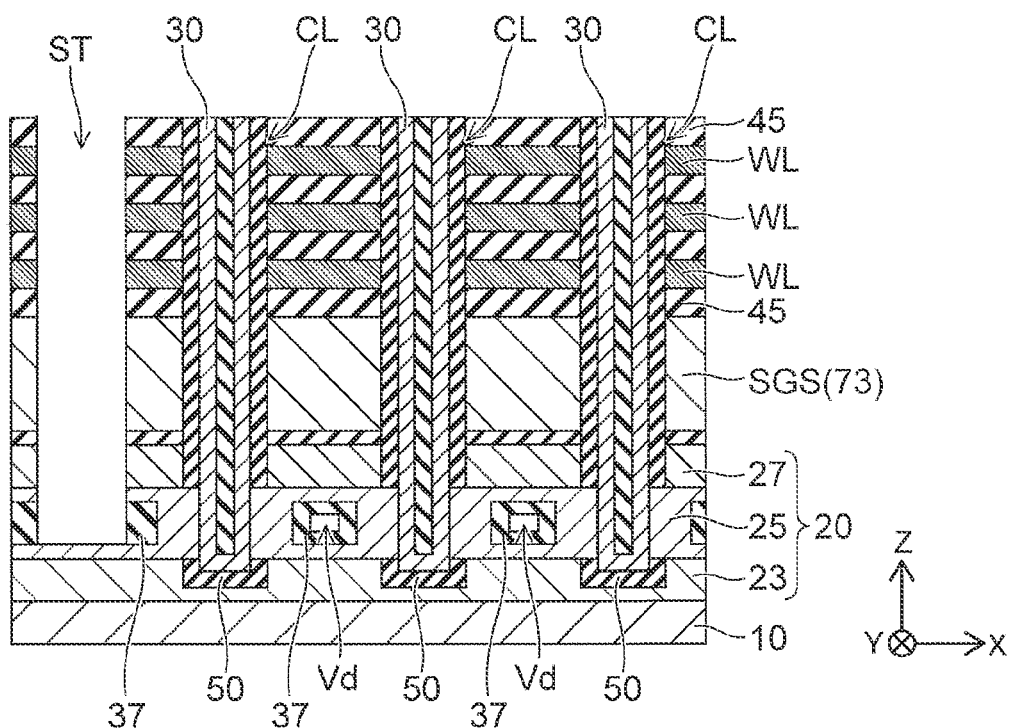

As shown in FIG. 10A, the word lines WL and the select gate SGD (not illustrated) are formed between the insulating films 45 adjacent to each other in the Z-direction. For example, the metal layer 79 that covers the inner surface of the slit ST is removed by isotropic dry etching or wet etching. Thereby, the portions of the metal layer 79 that are formed between the insulating films 45 are separated from each other; and the word lines WL and the select gate SGD are formed. At this time, the insulating film 47 (not illustrated) may remain on the inner surface of the slit ST.

Figure 10B:
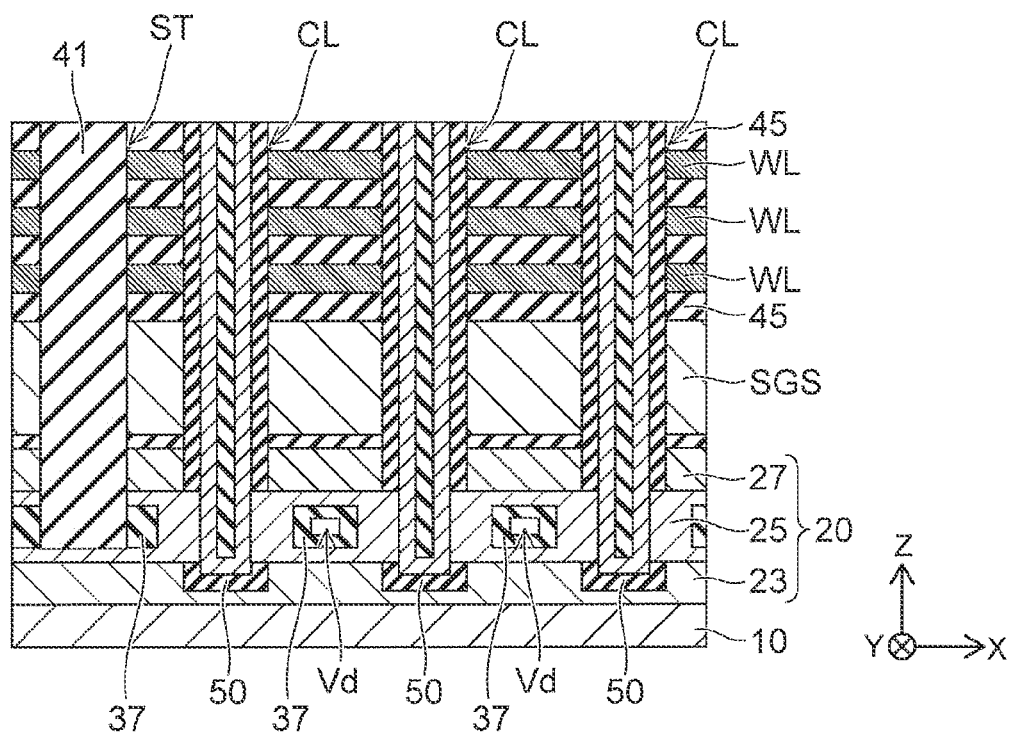

As shown in FIG. 10B, the insulating film 41 is formed in the interior of the slit ST. The insulating film 41 is, for example, a silicon oxide film and is formed to fill the space in the interior of the slit ST. Subsequently, the bit lines BL are formed above the select gate SGD (referring to FIG. 1). The bit lines BL are electrically connected via the connection plugs VB to the semiconductor layers 30 that are inside the columnar bodies CL.

Thus, in the semiconductor memory device 1 according to the embodiment, the residual space RS remains in the interior of the semiconductor layer 20; and the insulating film 37 is formed to cover the inner surface of the residual space RS. Thereby, it is possible to stabilize the connection between the semiconductor layer 20 and the semiconductor layer 30.

For example, when the second layer 25 is formed to fill the entire space SP1 after removing the sacrificial layer 25f, there may be a case where an unintended void remains in the interior of the second layer 25 due to the nonuniform growth of the second layer 25. Then, atoms that are included in the semiconductor layer 20 may move inside the void due to the thermal cycles through the manufacturing processes after the second layer 25 is formed; and the void may change the position thereof in the interior of the semiconductor layer 20. For example, in the case where the void is positioned at the vicinity of the contact portion CP of the semiconductor layer 30 inside the semiconductor layer 20, discrepancies may occur such that the electrical connection is broken or the contact resistance becomes large between the semiconductor layer 20 and the semiconductor layer 30, or the like.

In contrast, in the semiconductor memory device 1, the residual space RS is intentionally caused to remain in the interior of the semiconductor layer 20; the interior of the residual space RS is covered with the insulating film 37; thereby, it is possible to suppress the movement of the atoms included in the semiconductor layer 20. Thus, the electrical connection can be stabilized between the semiconductor layer 20 and the semiconductor layer 30; and it is possible to avoid the decrease of the manufacturing yield.

To promote the diffusion of impurities from the third layer 27 into the semiconductor layer 30, for example, it is preferable for the grain size of the poly-crystal of the third layer 27 to be smaller than the grain size of the poly-crystal of the first layer 23. Thereby, it is possible in the third layer 27 to enlarge the diffusion coefficients of the impurities, because the impurities move faster through the grain boundaries of the poly-crystal. As a result, the variations of the impurity concentrations can be suppressed at the lower ends of the semiconductor layers 30.

Second Embodiment

Figure 11:
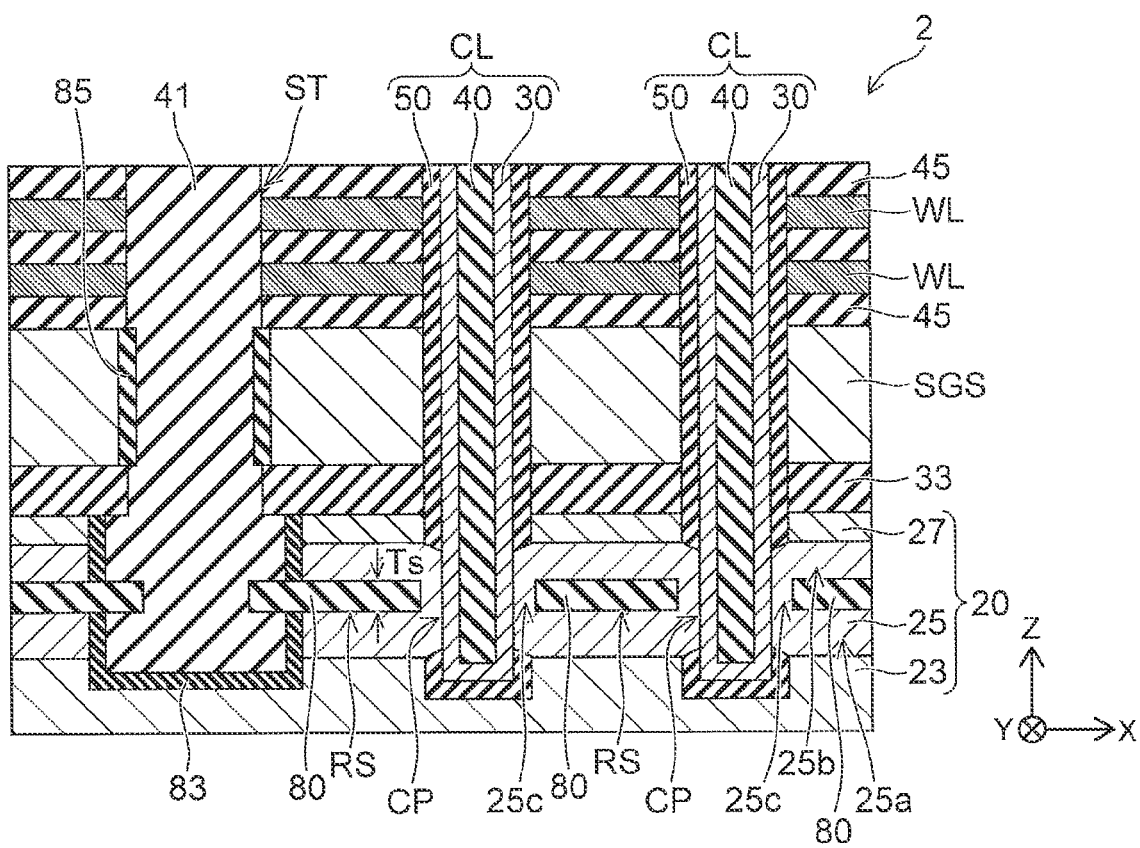
FIG. 11 is a schematic cross-sectional view showing a semiconductor memory device according to a second embodiment.

FIG. 11 is a schematic cross-sectional view showing a semiconductor memory device 2 according to a second embodiment. The semiconductor memory device 2 includes the semiconductor layer 20, the select gate SGS, the word lines WL, the select gate SGD (not-illustrated), and the columnar bodies CL.

The semiconductor layer 20 is provided on the metal layer 10 (not-illustrated) and includes the first layer 23, the second layer 25, and the third layer 27. The first layer 23, the second layer 25, and the third layer 27 are stacked in the Z-direction; and the second layer 25 is positioned between the first layer 23 and the third layer 27.

The word lines WL and the select gates SGS and SGD are stacked above the semiconductor layer 20. The columnar bodies CL extend in the Z-direction through the select gate SGS, the word lines WL, and the select gate SGD. Also, the columnar bodies CL extend into the interior of the semiconductor layer 20; and the lower ends of the columnar bodies CL are positioned inside the first layer 23.

The columnar body CL includes the semiconductor layer 30, the insulating core 40, and the memory film 50. The semiconductor layer 30 includes the contact portion CP positioned inside the semiconductor layer 20. At the contact portion CP, a portion of the memory film 50 is removed; and a portion of the semiconductor layer 30 is exposed.

The second layer 25 of the semiconductor layer 20 has the residual space RS in the interior of the second layer 25; and an insulating film 80 is provided inside the residual space RS. The second layer 25 includes the first portion 25a, the second portion 25b, and the third portion 25c. The first portion 25a is positioned between the first layer 23 and the insulating film 80. The second portion 25b is positioned between the third layer 27 and the insulating film 80. The third portion 25c is provided to link the first portion 25a and the second portion 25b. Also, the third portion 25c is provided to contact the contact portion CP of the semiconductor layer 30. The contact portion CP is provided to be separated from the insulating film 80 with the third portion 25c interposed.

In the example, the second layer 25 is formed so that the distance $W_S$ between the third portions 25c adjacent to each other in the X-Y plane (referring to FIG. 2B) is wider than the height $T_S$ in the Z-direction of the residual space RS. Therefore, when forming the insulating film 80, the interior of the residual space RS can be filled without the void Vd remaining therein before the space between the adjacent third portions 25c is plugged.

In the embodiment as well, by forming the insulating film 80 in the interior of the residual space RS, the movement of the atoms included in the semiconductor layer 20 can be suppressed; and the electrical connection can be stabilized between the semiconductor layer 20 and the semiconductor layer 30.

A method for manufacturing the semiconductor memory device 2 will now be described with reference to FIG. 12A to FIG. 16B. FIG. 12A to FIG. 16B are schematic cross-sectional views sequentially showing manufacturing processes of the semiconductor memory device 2.

Figure 12A:
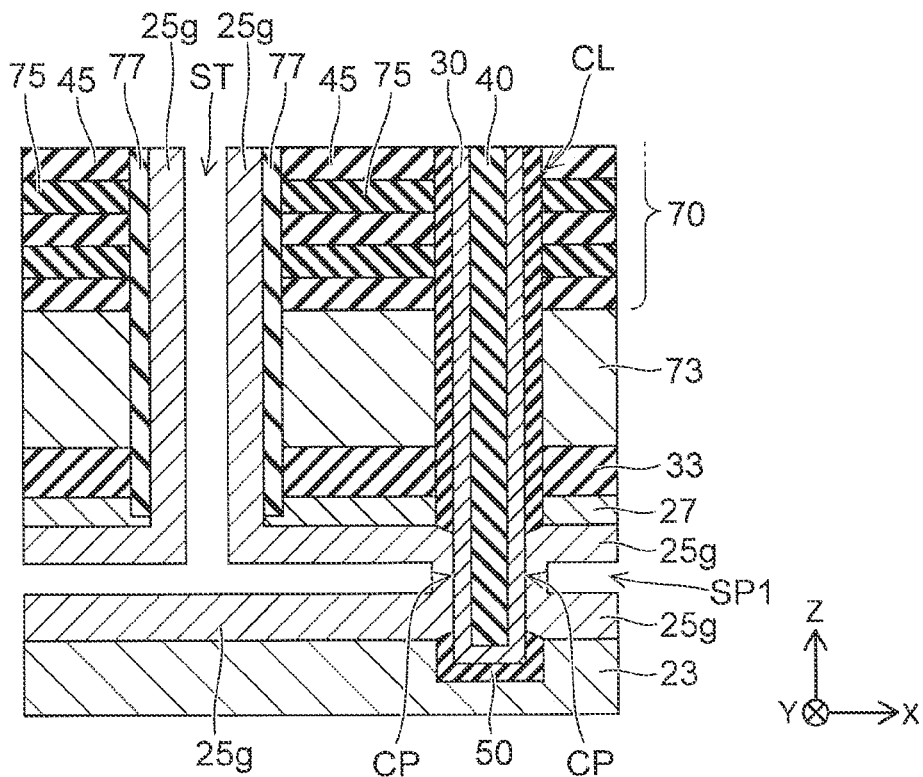
FIG. 12A to FIG. 16B are schematic cross-sectional views showing manufacturing processes of the semiconductor memory device according to the second embodiment.

FIG. 12A is a schematic cross-sectional view showing a manufacturing process continuing from FIG. 7A. As shown in FIG. 12A, a semiconductor layer 25g is formed inside the space SP1 after removing the sacrificial layer 25f and the intermediate films 63 and 65 (referring to FIG. 6A). The semiconductor layer 25g is formed to cover the inner surface of the space SP1 and the inner surface of the slit ST. Also, the semiconductor layer 25g is formed to contact the contact portions CP of the semiconductor layers 30. The semiconductor layer 25g is, for example, a polysilicon layer formed using CVD. The semiconductor layer 25g is formed with a thickness capable of leaving a space that remains between the first layer 23 and the third layer 27 and in the interior of the slit ST.

Figure 12B:
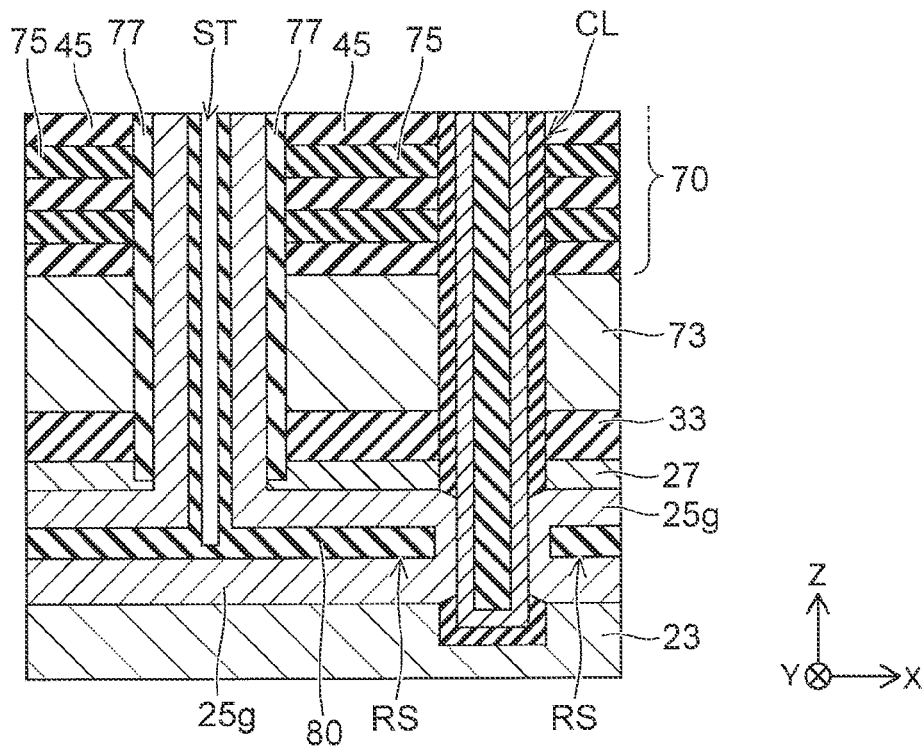

As shown in FIG. 12B, the insulating film 80 is formed to fill the residual space RS between the first layer 23 and the third layer 27. The insulating film 80 is, for example, a silicon oxide film. Also, the insulating film 80 is formed to have a thickness capable of forming a space that remains in the interior of the slit ST.

Figure 13A:
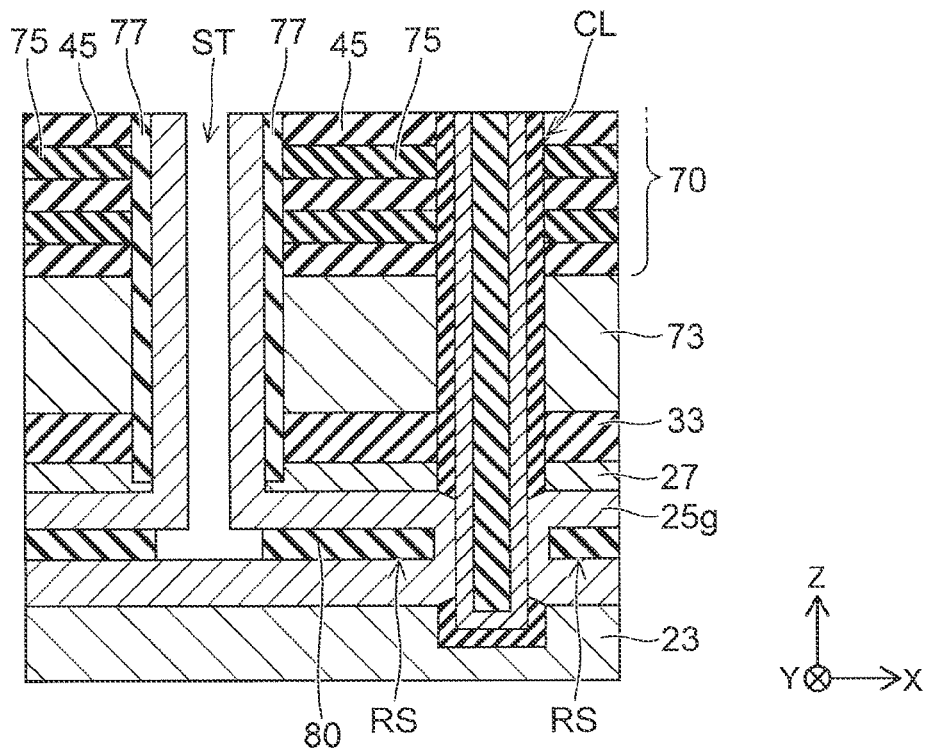

As shown in FIG. 13A, the insulating film 80 is removed, which is formed in the interior of the slit ST. For example, the insulating film 80 is removed using isotropic dry etching or wet etching.

Figure 13B:
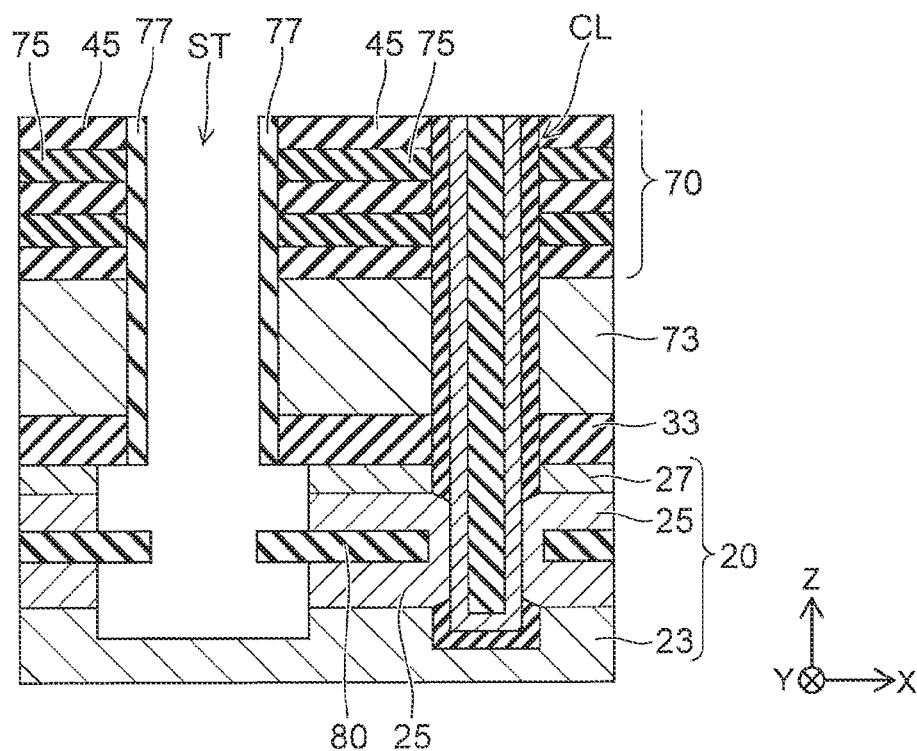

As shown in FIG. 13B, the portion of the semiconductor layer 25g is removed, which is formed inside the slit ST. For example, the semiconductor layer 25g is removed using isotropic dry etching or wet etching. Hereinbelow, the portion of the semiconductor layer 25g remaining between the first layer 23 and the third layer 27 is referred to as the second layer 25.

Figure 14A:
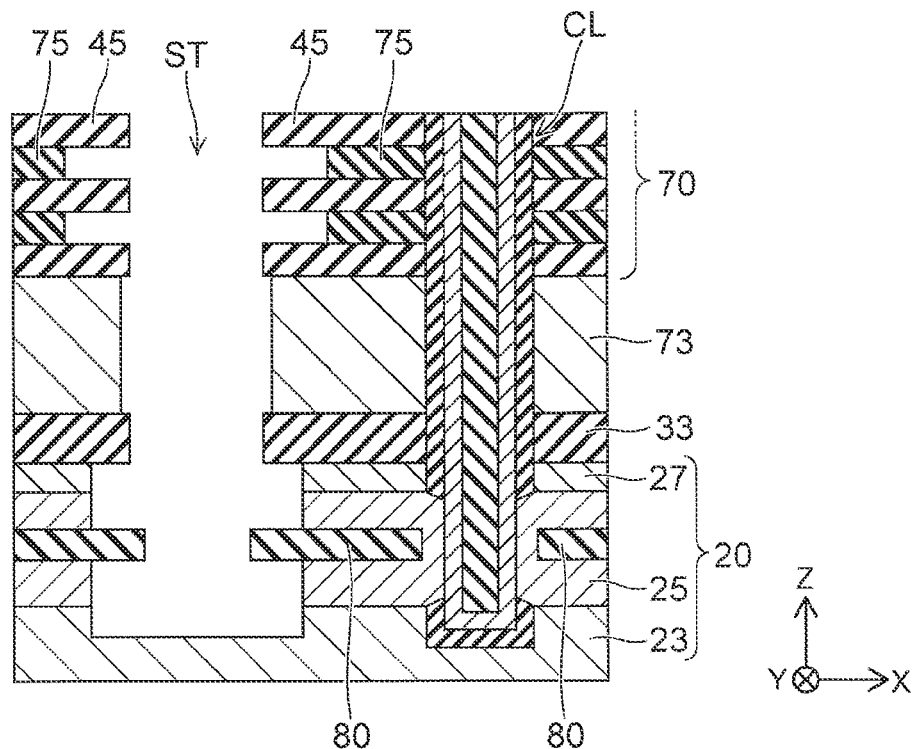

As shown in FIG. 14A, the insulating film 77 is removed, which covers the inner wall of the slit ST. In the case where the resistance of the sacrificial films 75 to the etching conditions of the insulating film 77 is small, portions of the sacrificial films 75 also may be removed when removing the insulating film 77.

Figure 14B:
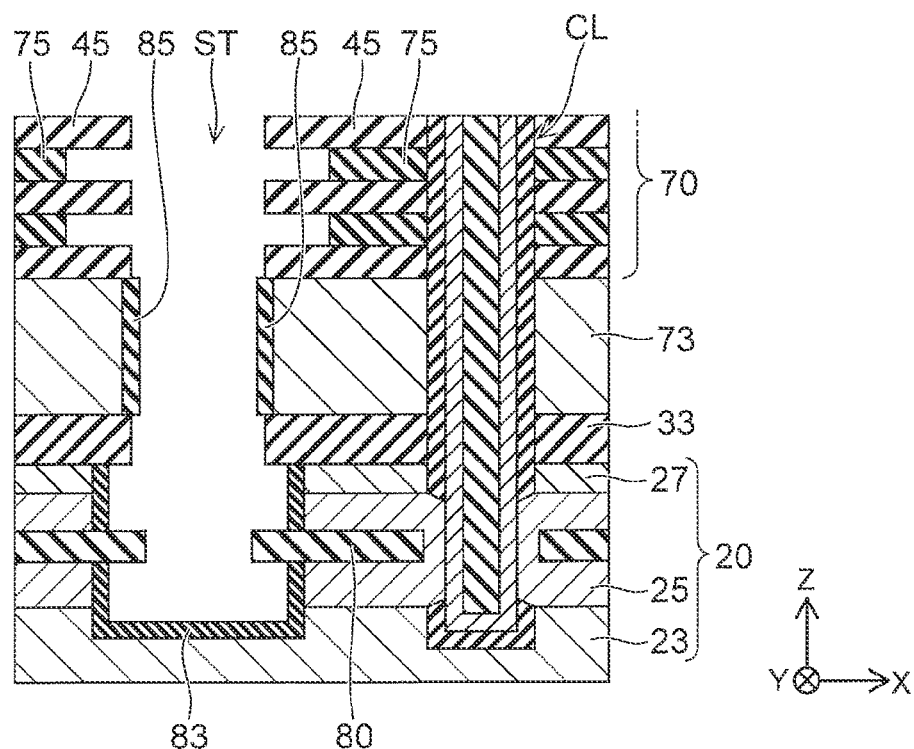

As shown in FIG. 14B, an insulating film 83 is formed on the end surface of the third layer 27, the end surface of the second layer 25, and the surface of the first layer 23 exposed at the inner surface of the slit ST; and an insulating film 85 is formed on the end surface of the semiconductor layer 73. The insulating films 83 and 85 are, for example, silicon oxide films. For example, the insulating films 83 and 85 are formed by performing thermal oxidation of the first layer 23, the second layer 25, the third layer 27, and the semiconductor layer 73.

Figure 15A:
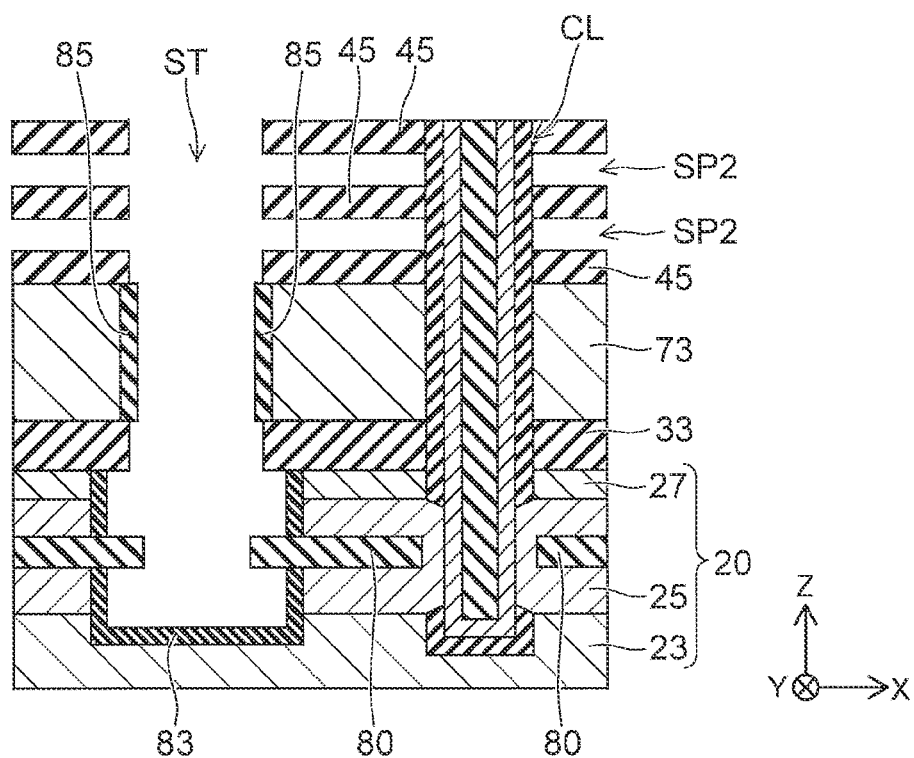

As shown in FIG. 15A, the spaces SP2 are formed between the insulating films 45 adjacent to each other in the Z-direction. For example, the spaces SP2 are formed by selectively removing the sacrificial films 75 using etchant supplied via the slit ST.

Figure 15B:
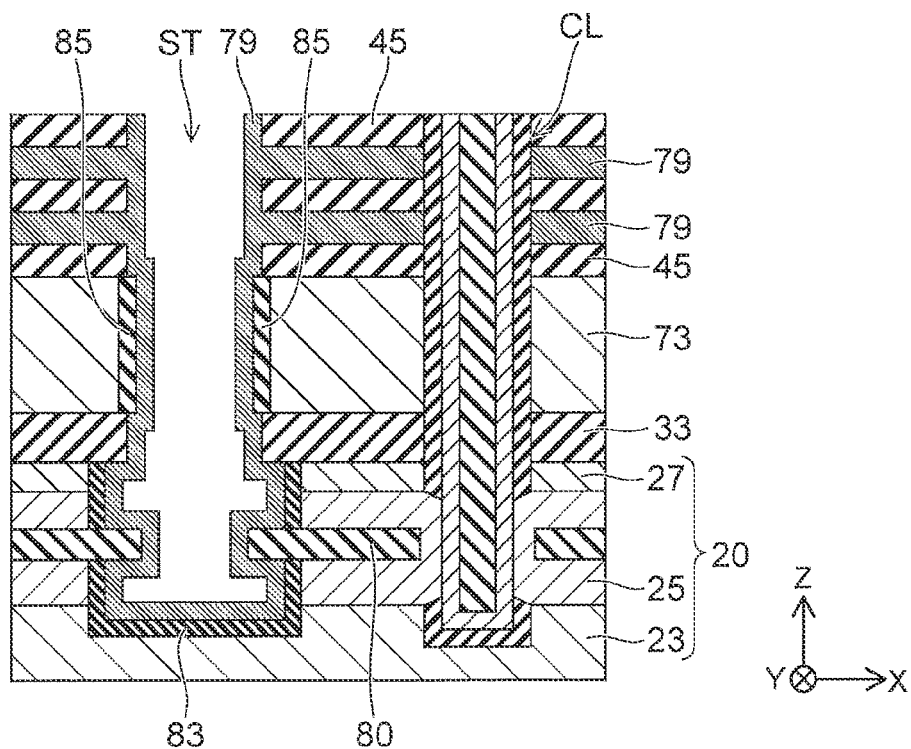

As shown in FIG. 15B, the metal layer 79 is formed to fill the spaces SP2. The insulating film 47 is not illustrated in FIG. 15B and the following drawings. The insulating film 47 is formed to cover the inner surfaces of the spaces SP2 before forming the metal layer 79. The insulating film 47 is, for example, an insulative metal oxide film formed using CVD.

Figure 16A:
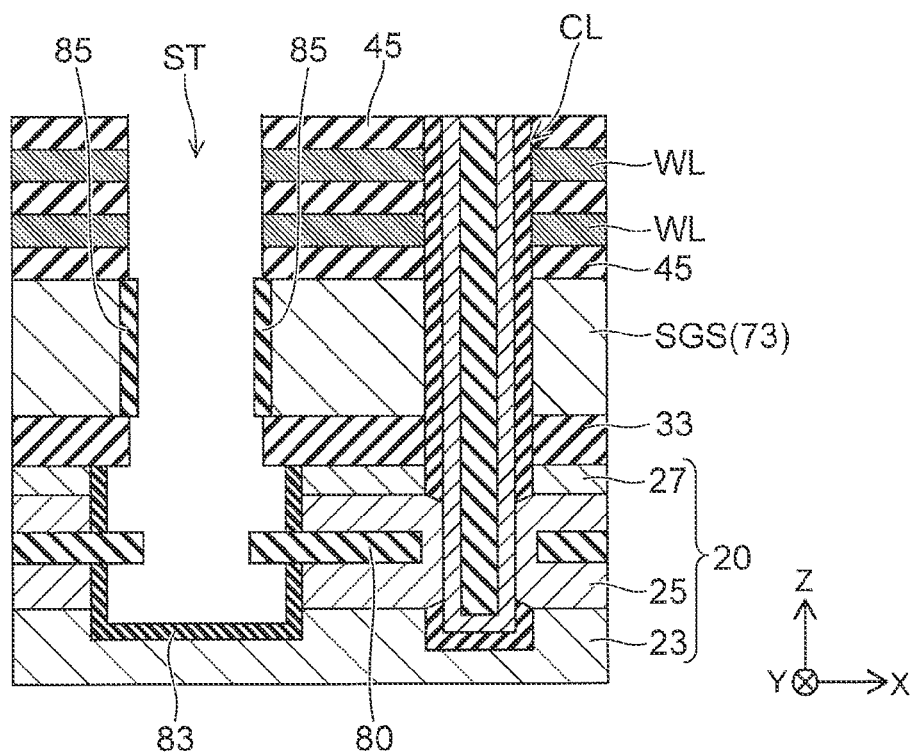

As shown in FIG. 16A, the word lines WL and the select gate SGD (not illustrated) are formed between the insulating films 45 adjacent to each other in the Z-direction by removing the portion of the metal layer 79 covering the inner surface of the slit ST. At this time, the portion of the insulating film 47 (not illustrated) may remain on the inner surface of the slit ST. The insulating films 83 and 85 protect the first layer 23, the second layer 25, the third layer 27, and the semiconductor layer 73 in the process of replacing the sacrificial films 75 with the word lines WL and the select gate SGD.

Figure 16B:
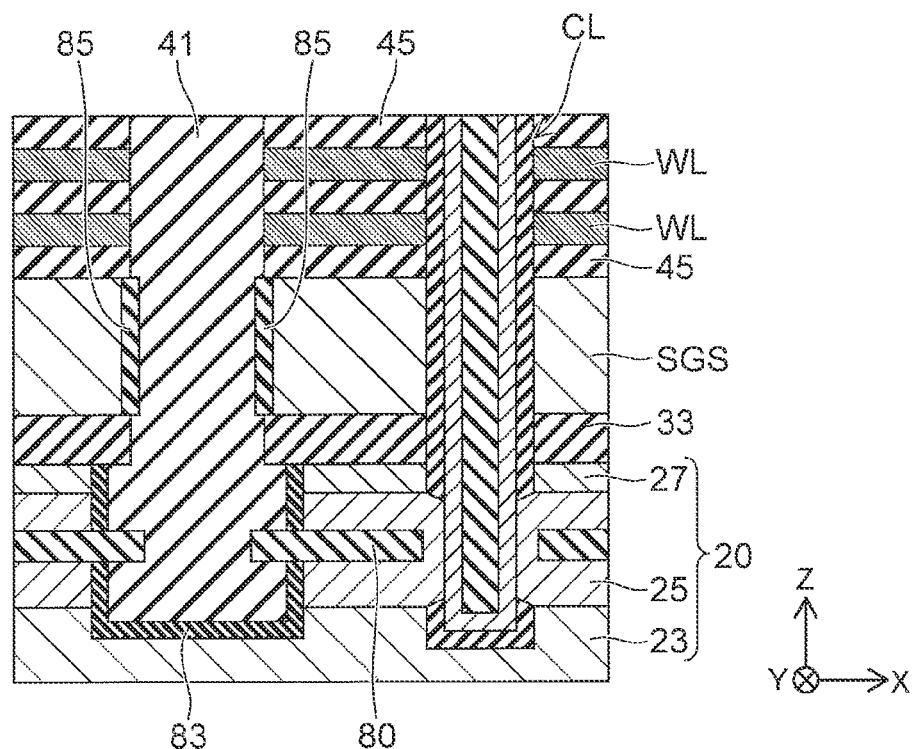

As shown in FIG. 16B, the insulating film 41 is formed in the interior of the slit ST. The insulating film 41 is, for example, a silicon oxide film. Then, the bit lines BL are formed above the select gate SGD; and the semiconductor memory device 2 is completed (referring to FIG. 1).

Figure 17:
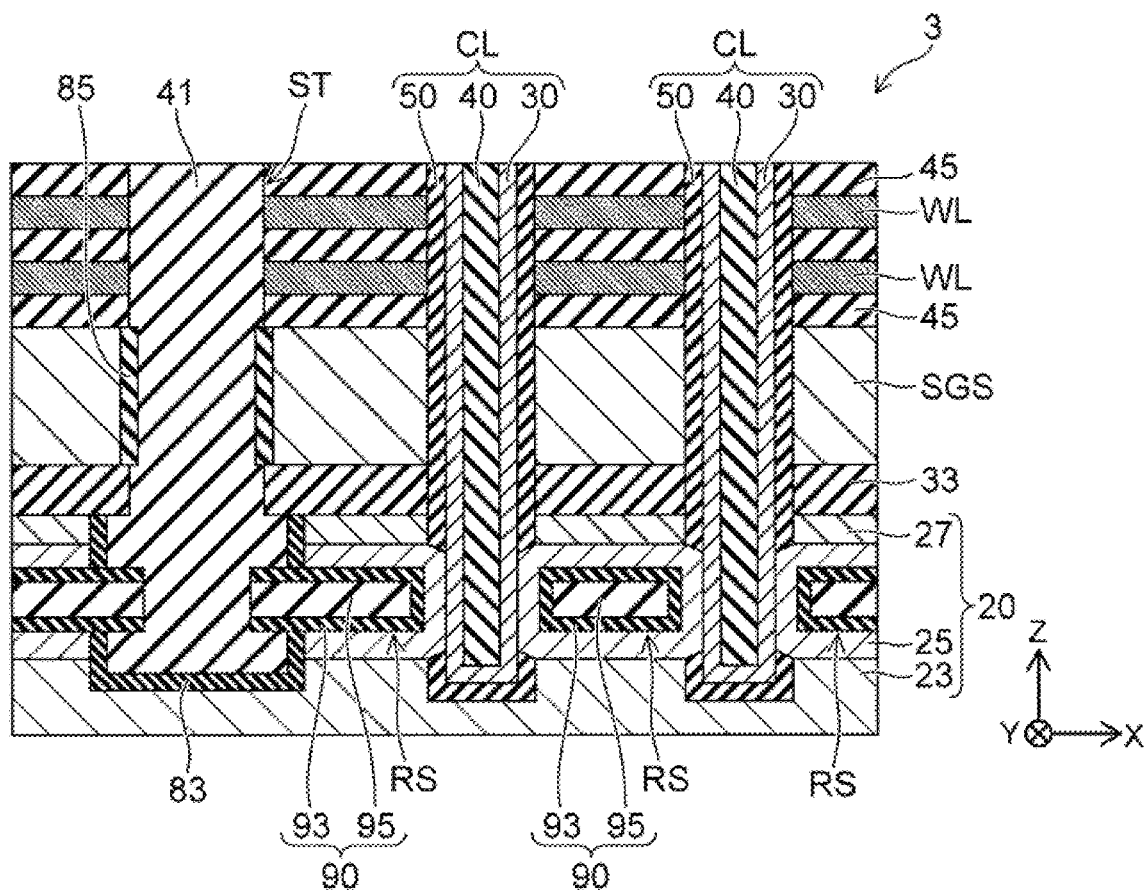
FIG. 17 is a schematic cross-sectional view showing a semiconductor memory device according to a modification of the second embodiment.

FIG. 17 is a schematic cross-sectional view showing a semiconductor memory device 3 according to a modification of the second embodiment. In the semiconductor memory device 3, an insulating film 90 is provided inside the residual space RS of the semiconductor layer 20. The insulating film 90 includes a first layer 93 covering the inner surface of the residual space RS, and a second layer 95 filling the residual space RS.

The insulating film 90 is formed by, for example, depositing the first layer 93 and the second layer 95 in order by using CVD in the manufacturing process shown in FIG. 12B. The first layer 93 is, for example, a silicon nitride film or a silicon oxynitride film (a SiON film). The second layer 95 is, for example, a silicon oxide film.

In the example, by providing the insulating film 90 in the residual space RS inside the semiconductor layer 20, the movement of the atoms included in the semiconductor layer 20 can be suppressed; and the electrical connection can be stabilized between the semiconductor layer 20 and the semiconductor layer 30. Further, by using a material in the first layer 93 that can suppress the penetration of oxidizing agents such as oxygen, etc., for example, the oxidization of the second layer 25 can be suppressed in the manufacturing process shown in FIG. 14B.

For example, the electrical resistance of the semiconductor layer 20 increases in the case where an oxidizing agent such as oxygen or the like moves through the residual space RS via the insulating film 90 and thermal oxidation of the entire inner surface of the second layer 25 occurs. Thus, the discrepancy may occur such that the operation speed is lowered in the semiconductor memory device 3. In the embodiment, such a discrepancy can be avoided by providing the first layer 93.

Instead of the insulating film 90, a film that includes a semiconductor material may be used. For example, a silicon nitride film or a silicon oxynitride film may be used as the first layer 93; and an amorphous silicon film or a polysilicon film may be used as the second layer 95.

Also, a metal layer may be used instead of the insulating film 90. A barrier metal such as titanium nitride (TiN), etc., may be used as the material of the first layer 93; and a metal may be used as the material of the second layer 95. Thereby, it is possible to reduce the electrical resistance of the source layer SL.

Third Embodiment

Figure 18:
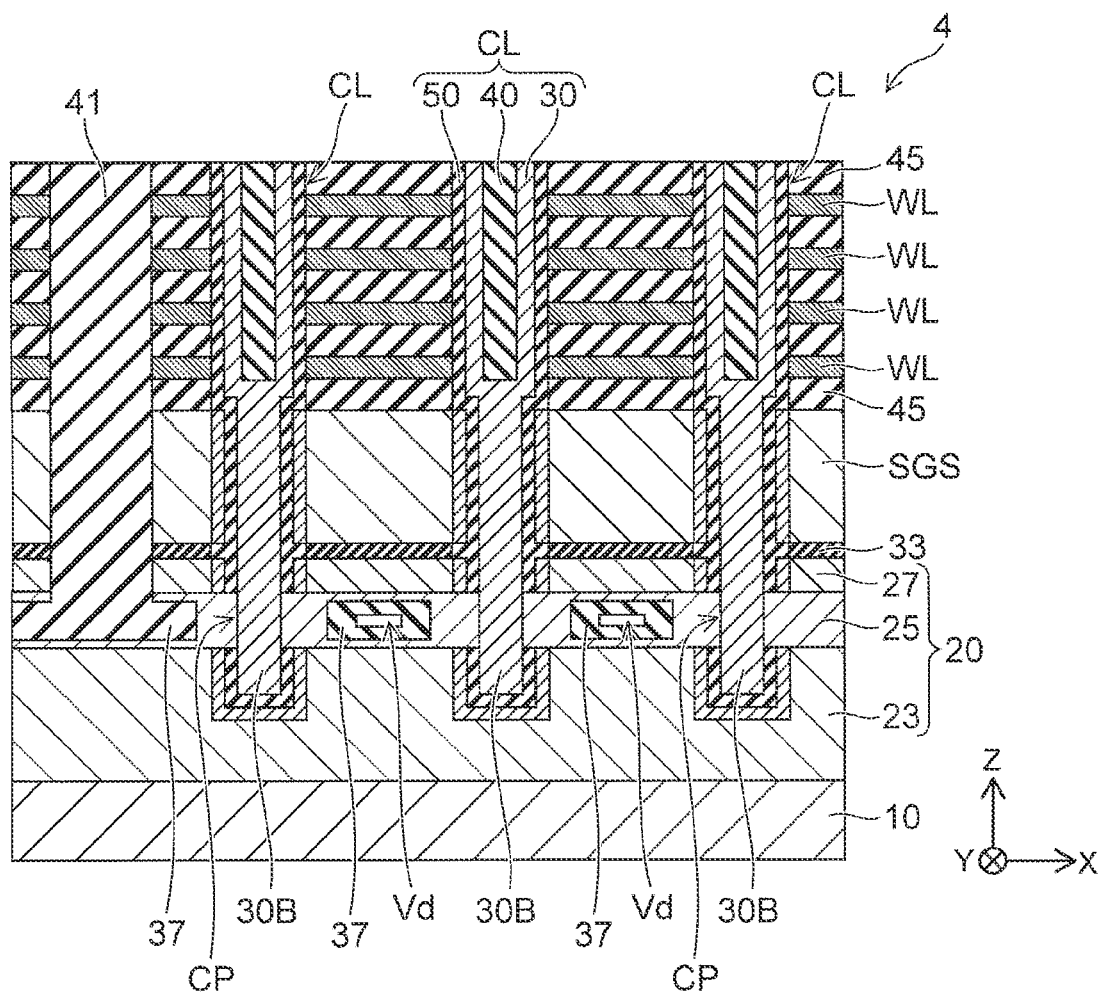
FIG. 18 is a schematic cross-sectional view showing a semiconductor memory device 4 according to a third embodiment.

FIG. 18 is a schematic cross-sectional view showing a semiconductor memory device 4 according to a third embodiment. The semiconductor memory device 4 includes the metal layer 10, the semiconductor layer 20, the select gate SGS, the word lines WL, the select gate SGD (not-illustrated), and the columnar bodies CL.

The semiconductor layer 20 is provided on the metal layer 10 and includes the first layer 23, the second layer 25, and the third layer 27. The first layer 23, the second layer 25, and the third layer 27 are stacked in the Z-direction; and the second layer 25 is positioned between the first layer 23 and the third layer 27.

The word lines WL and the select gates SGS and SGD are stacked above the semiconductor layer 20. The columnar bodies CL extend in the Z-direction through the select gate SGS, the word lines WL, and the select gate SGD. Also, the columnar bodies CL extend into the interior of the semiconductor layer 20; and the lower ends of the columnar bodies CL are positioned inside the first layer 23.

The columnar body CL includes the semiconductor layer 30, the insulating core 40, and the memory film 50. The semiconductor layer 30 includes the contact portion CP positioned inside the semiconductor layer 20. At the contact portion CP, a portion of the memory film 50 is removed; and a portion of the semiconductor layer 30 is exposed.

In the embodiment, the insulating core 40 is provided in a portion of the columnar body CL that extends through the multiple word lines WL. The insulating core 40 is not provided in the portion of the columnar body CL extending through the select gate SGS or the portion of the columnar body CL extending inside the semiconductor layer 20. In other words, the portion of the semiconductor layer 30 extending through the select gate SGS and extending inside the semiconductor layer 20 include a semiconductor to the center thereof.

The second layer 25 of the semiconductor layer 20 has the residual space RS in the interior of the second layer 25; and the insulating film 37 is provided to cover the inner surface of the residual space RS. The insulating film 37 has the void Vd in the interior of the insulating film 37. Also, the second layer 25 is provided to contact the contact portion CP of the semiconductor layer 30.

A method for manufacturing the semiconductor memory device 4 will now be described with reference to FIG. 19A to FIG. 21B. FIG. 19A to FIG. 21B are schematic cross-sectional views sequentially showing the manufacturing processes of the semiconductor memory device 4.

Figure 19A:
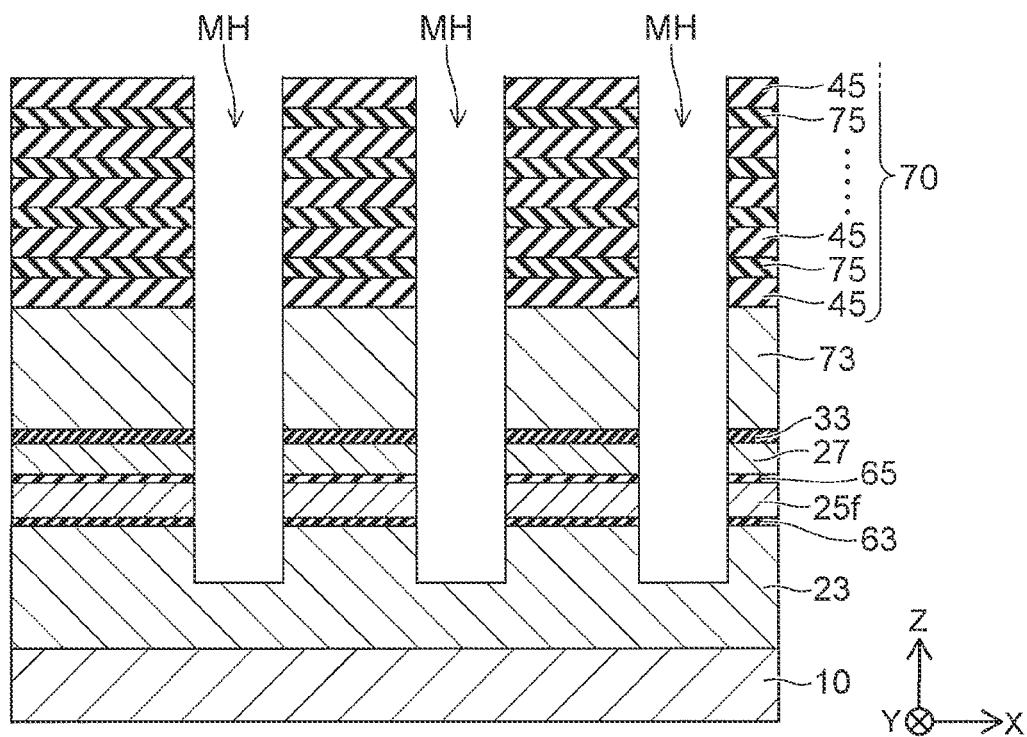
FIGS. 19A to 21B are schematic cross-sectional views showing the manufacturing processes of the semiconductor memory device according to the third embodiment.

FIG. 19A is a schematic cross-sectional view showing a manufacturing process continuing from FIG. 4B. As shown in FIG. 19A, the memory holes MH are formed with depths capable of reaching the first layer 23 of the semiconductor layer 20 from the upper surface of the stacked body 70.

Figure 19B:
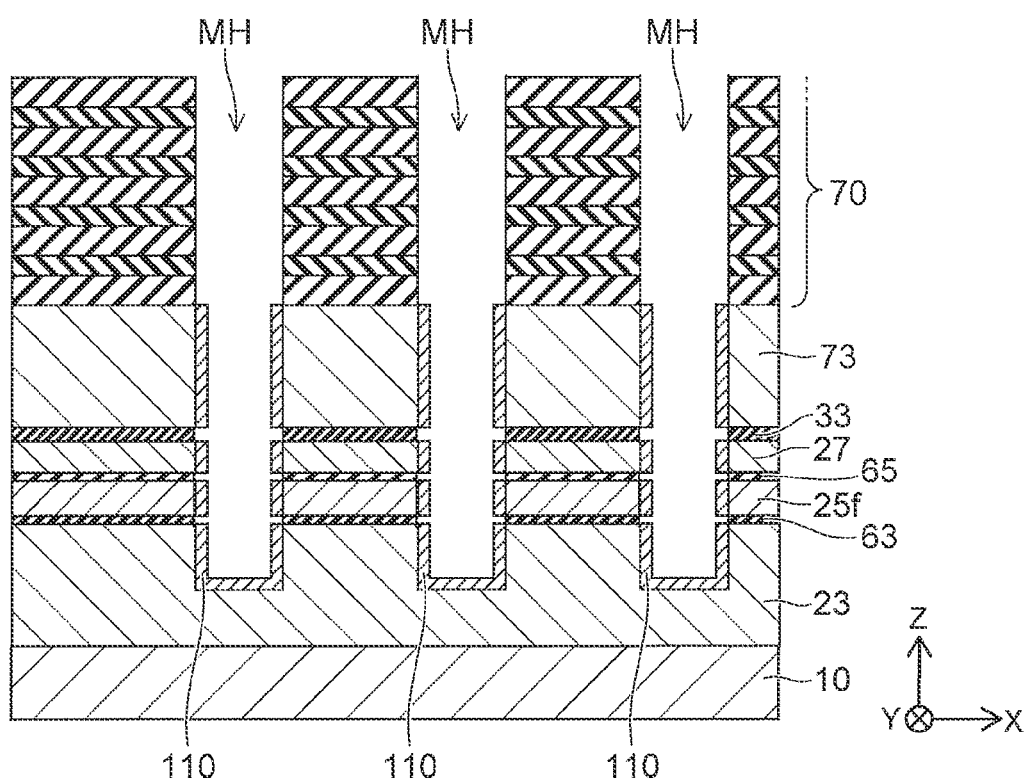

As shown in FIG. 19B, a semiconductor layer 110 is formed on the surfaces of the first layer 23, the sacrificial layer 25*f*, the third layer 27, and the semiconductor layer 73 that are exposed in the interiors of the memory holes MH. The semiconductor layer 110 is, for example, a silicon layer and is formed selectively on the first layer 23, the sacrificial layer 25*f*, the third layer 27, and the semiconductor layer 73. The semiconductor layer 110 is, for example, an epitaxial layer. Thereby, the diameters of the memory holes MH are reduced at the portions extending through the sacrificial layer 25*f*, the third layer 27, and the semiconductor layer 73.

Figure 20A:
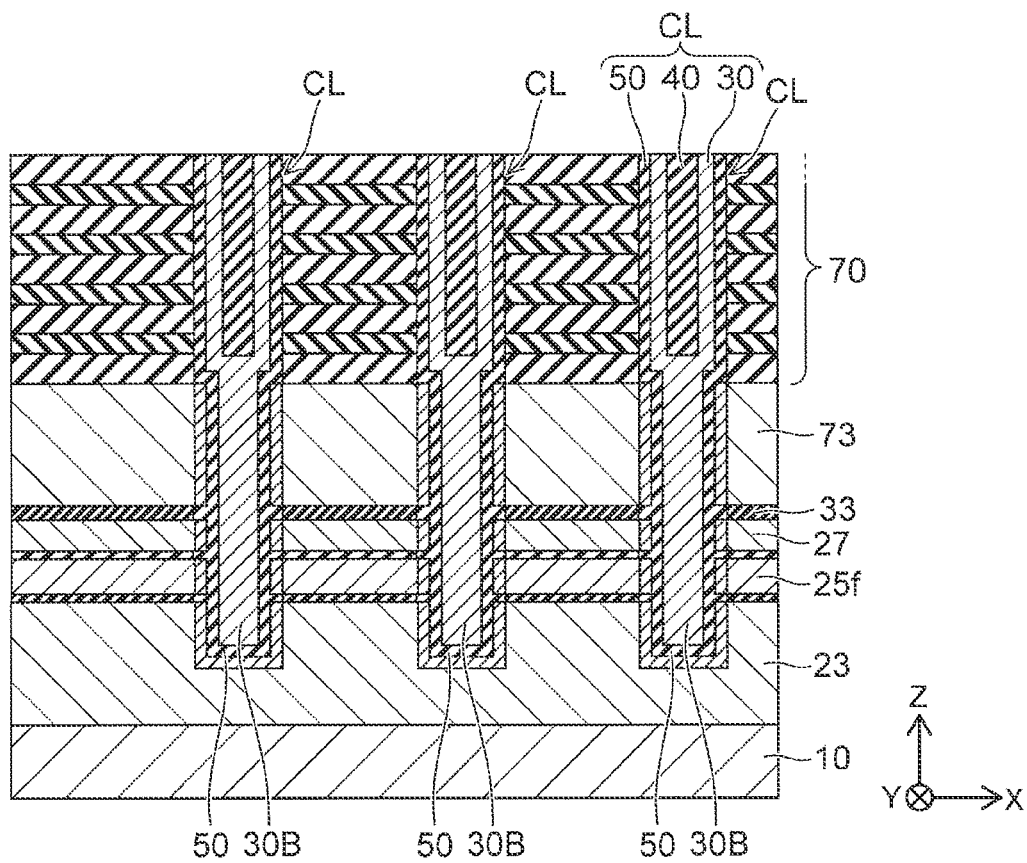

As shown in FIG. 20A, the columnar bodies CL are formed in the interiors of the memory holes MH. In the columnar bodies CL, the memory film 50 that covers the inner surfaces of the memory holes MH is formed; subsequently, the semiconductor layer 30 is formed on the memory film 50. Subsequently, the insulating core 40 is formed to fill the spaces remaining inside the memory holes MH.

In the example, the diameters of the memory holes MH are reduced at the portions extending through the sacrificial layer 25*f*, the third layer 27, and the semiconductor layer 73; therefore, these portions are plugged when the memory film 50 and the semiconductor layer 30 are formed. Accordingly, the insulating core 40 is formed at the portion of the columnar body CL extending through the stacked body 70. The insulating core 40 is not formed at the lower end portion that extends through the sacrificial layer 25*f*, the third layer 27, and the semiconductor layer 73. A lower end portion 30B of the semiconductor layer 30 extends inside the first layer 23, the sacrificial layer 25*f*, the third layer 27, and the semiconductor layer 73 and includes a semiconductor to the center of the lower end portion 30B.

Figure 20B:
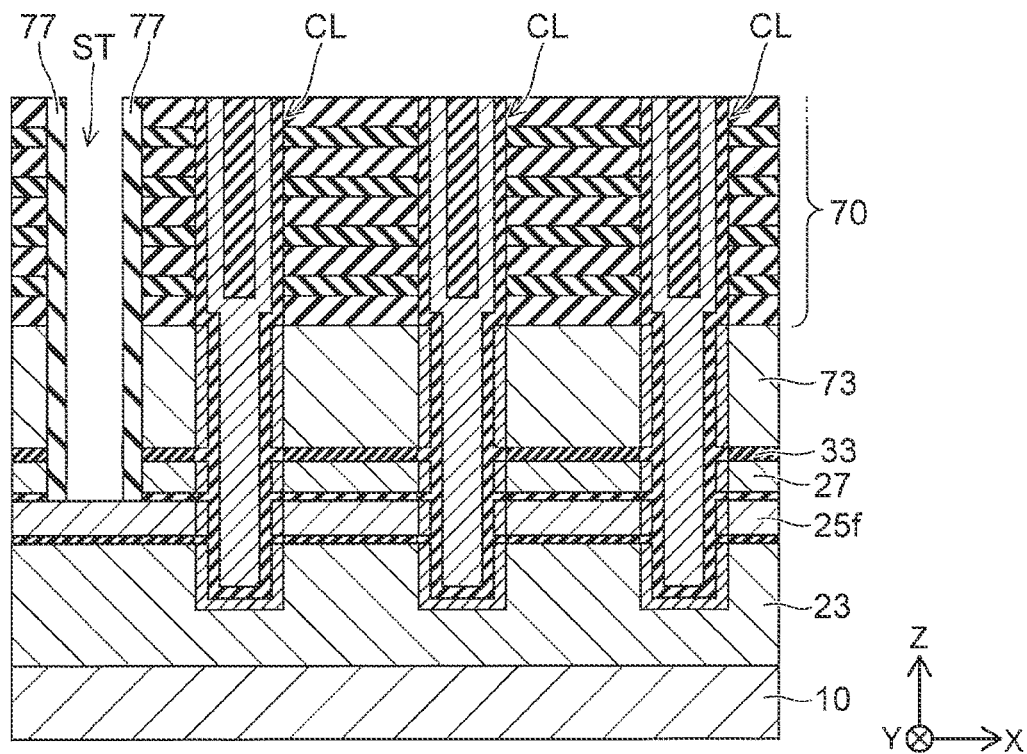

As shown in FIG. 20B, the slit ST that has a depth reaching the sacrificial layer 25*f* is formed to subdivide the stacked body 70 and the semiconductor layer 73. Further, the insulating film 77 that covers the inner wall of the slit ST is formed. The sacrificial layer 25*f* is exposed at the bottom surface of the slit ST.

Figure 21A:
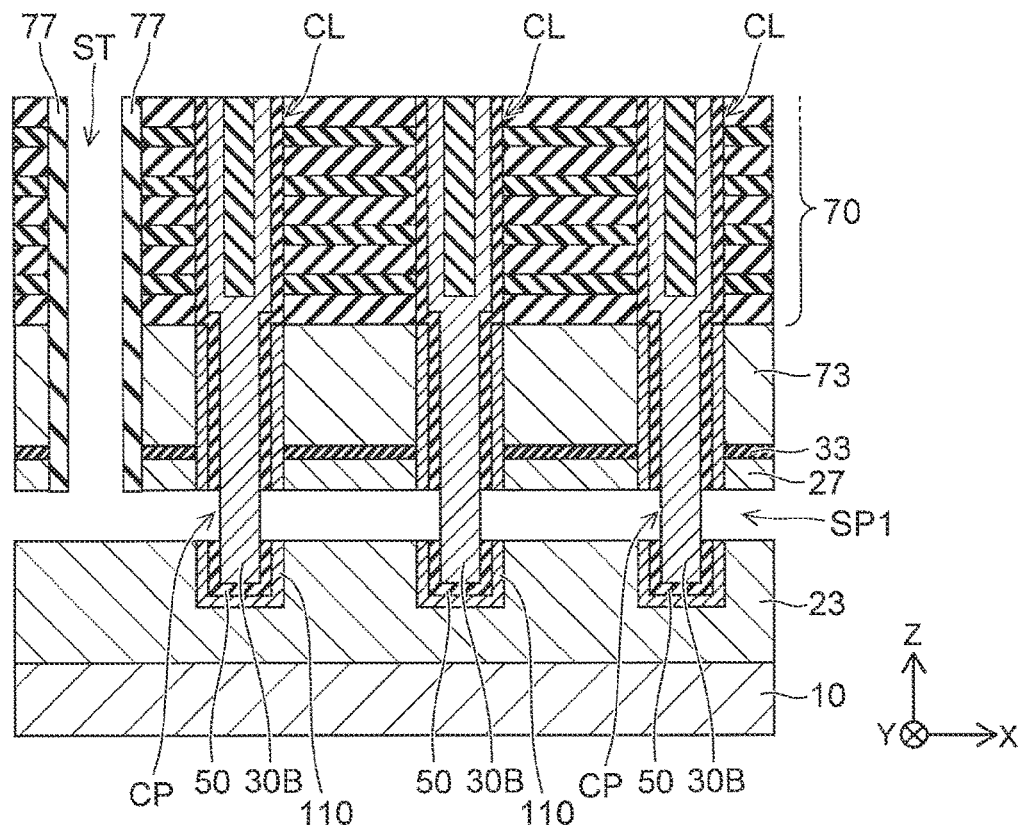

As shown in FIG. 21A, the space SP1 is formed between the first layer 23 and the third layer 27 by selectively removing the sacrificial layer 25*f*. At this time, the semiconductor layer 110 also is removed, which is formed on the end surface of the sacrificial layer 25*f*. Then, the first layer 23, the third layer 27, and a portion of the semiconductor layer 30 are exposed by selectively removing the intermediate film 65, the intermediate film 63, and a portion of the memory film 50 exposed in the interior of the space SP1.

Figure 21B:
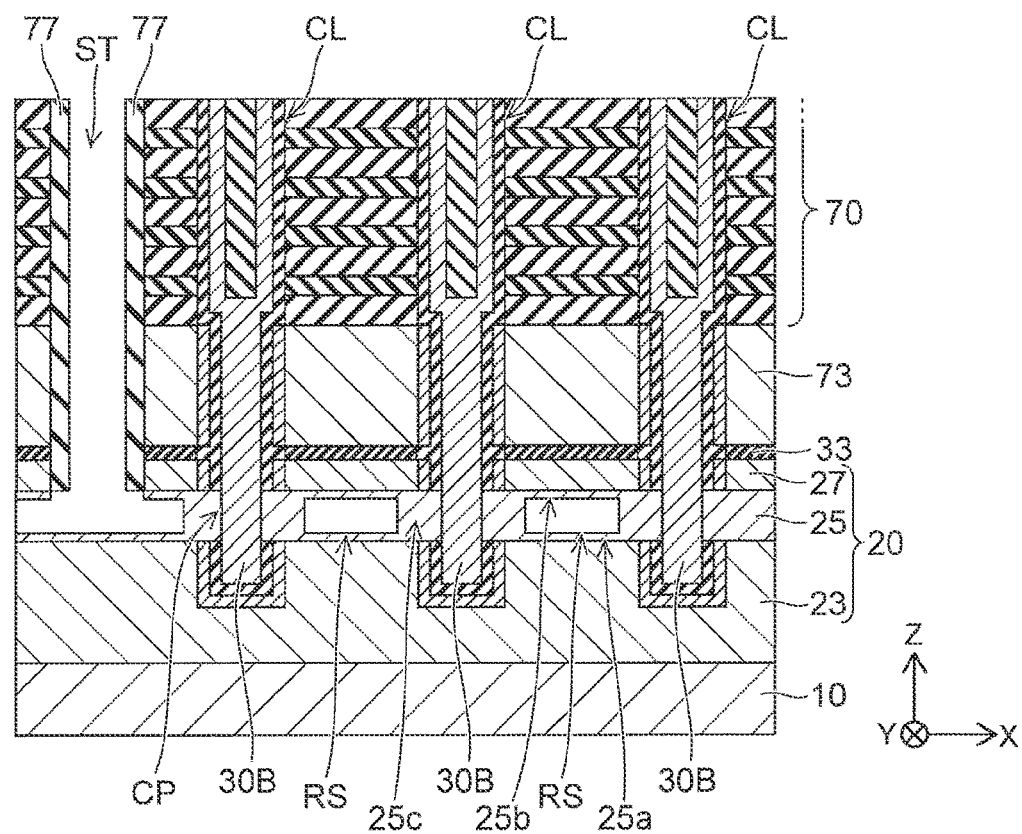

As shown in FIG. 21B, the second layer 25 is formed in the interior of the space SP1. The second layer 25 is formed selectively on the first layer 23, the third layer 27, and the contact portion CP of the semiconductor layer 30. Also, the second layer 25 is formed such that the residual space RS remains in the interior of the second layer 25. Subsequently, the semiconductor memory device 4 is completed by performing the manufacturing processes shown in FIG. 8A to FIG. 10B.

In the example as well, the second layer 25 includes the first portion 25*a* formed on the first layer 23, the second portion 25*b* formed on the third layer 27, and the third portion 25*c* formed on the contact portion CP.

The contact portion CP is a portion of the lower end portion 30B of the semiconductor layer 30. The lower end portion 30B has the widths in the X-direction and the Y-direction that are formed to be, for example, wider than the film thicknesses of the semiconductor layer 30 that is the thickness in the X-direction and the Y-direction of the portion positioned between the insulating core 40 and the memory film 50. Therefore, in the semiconductor layer 30, the grain size of the poly-crystal of the lower end portion 30B is larger than the grain size of the poly-crystal of the portion positioned between the insulating core 40 and the memory film 50.

Also, the grain size of the poly-crystal of the lower end portion 30B is larger than the grain size of the poly-crystal of the first layer 23 and the third layer 27. Therefore, the growth rate of the third portion 25*c* is larger than the growth rate of the first portion 25*a* and the growth rate of the second portion 25*b*. In other words, the thicknesses in the X-direction and the Y-direction of the third portion 25*c* are thicker than the thickness in the Z-direction of the first portion 25*a* and the thickness in the Z-direction of the second portion 25*b*. Thereby, the distance $W_S$ between the adjacent third portions 25*c* (referring to FIG. 2B) is narrower than the height $T_S$ in the Z-direction of the residual space RS remaining in the interior of the second layer 25 (referring to FIG. 2A). As a result, the insulating film 37 that covers the inner surface of the residual space RS is formed such that the void Vd remains in the interior of the insulating film 37.

In the embodiment as well, because the insulating film 37 is formed to cover the inner surface of the residual space RS, it is possible to suppress the movement of the atoms included in the semiconductor layer 20; and the electrical connection can be stabilized between the semiconductor layer 20 and the semiconductor layer 30.

Also, because the lower portion of the semiconductor layer 30 has a structure not including the insulating core 40, it is possible to suppress the impurity diffusion from the semiconductor layer 20 to the semiconductor layer 30. In other words, by suppressing the impurity diffusion through the insulating core 40, the variations of the impurity distribution can be suppressed among the semiconductor layers 30. Thereby, for example, it is possible to suppress the variations of the GIDL current (Gate Induced Drain Leakage Current) flowing in the semiconductor layers 30 when erasing data.

The embodiment is not limited to the examples recited above. For example, the second layer 25 may be formed to fill the space SP1 so that the residual space RS does not remain. In such a case, an unintended void may be formed inside the second layer 25; and even if the void may moves to the vicinity of the contact portion CP, it is possible to maintain the electrical connection between the semiconductor layer 20 and the semiconductor layer 30, because the lower end portion 30B of the semiconductor layer 30 is formed to have the large width. Moreover, similar to the word lines WL, the select gate SGS may be formed by a method of replacing the sacrificial film 75 with a metal layer. In such a case, the insulating core 40 extends to a portion of the columnar body CL crossing the select gate SGS.

While the semiconductor memory devices 1 to 4 according to the first to third embodiments are described above, the components described in each embodiment are not unique to each embodiment and are mutually applicable within the extent of technical feasibility.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device, comprising:
   a first semiconductor layer;
   a first insulating layer provided on the first semiconductor layer;
   a plurality of electrode layers provided above the first insulating layer, the plurality of electrode layers stacked in a first direction;
   a second semiconductor layer extending through the plurality of electrode layers and the first insulating layer in the first direction and extending inside the first semiconductor layer, the second semiconductor layer including a contact portion in contact with the first semiconductor layer; and
   a first film provided inside the first semiconductor layer, wherein
   the first semiconductor layer includes a first portion, a second portion, a third portion, a fourth portion, and a fifth portion, the first portion being provided in a position between the first film and the first insulating layer, the first film being provided in a position between the first portion and the second portion, the first and second portions being arranged in the first direction, the third portion being provided in a position between the first film and the second semiconductor layer, the third portion being connected to the first and second portions, the third portion of the first semiconductor layer being in contact with the contact portion of the second semiconductor layer, the fourth portion being located between the first film and the first portion in the first direction, the fifth portion being located between the first film and the second portion in the first direction,
   the first film includes a first layer and a second layer, the first layer being provided between the second layer and the first semiconductor layer, the first layer being provided above, below, and to a side of the second layer, the second layer being comprised of a material different from a material of the first layer, and
   a lower end of the first semiconductor layer is located lower than a lower end of the second semiconductor layer.

2. The device according to claim 1, wherein the first film is an insulating film.

3. The device according to claim 1, wherein the first film is a metal film.

4. The device according to claim 1, wherein
   the first semiconductor layer has a void, and
   the first film is provided in the void and in contact with the first semiconductor layer.

5. The device according to claim 1, further comprising:
   a second film extending in the first direction along the second semiconductor layer,
   the second film including a third portion and a fourth portion, the third portion being provided between the second semiconductor layer and the plurality of electrode layers, the fourth portion being provided in the first semiconductor layer, the fourth portion being apart from the third portion, the fourth portion being provided between a lower end of the second semiconductor layer and the first semiconductor layer,
   the first semiconductor layer being connected to the contact portion of the second semiconductor layer between the third portion of the second film and the fourth portion of the second film.

6. The device according to claim 5, wherein the second film includes a charge storage portion positioned between the second semiconductor layer and at least one of the plurality of electrode layers.

7. The device according to claim 1, further comprising:
   an insulating core provided inside the second semiconductor layer, the insulating core extending in the first direction,
   the second semiconductor layer including a third portion and fourth portion, the third portion of the second semiconductor layer being provided between the insulating core and the plurality of electrode layers,
   the fourth portion of the second semiconductor layer being provided inside the first semiconductor layer, the insulating core not including a portion provided in the fourth portion of the second semiconductor layer.

8. The device according to claim 1, wherein the first semiconductor layer includes at least one of phosphorus (P), boron (B), or carbon (C) as an impurity.

9. The device according to claim 1, wherein
   the first layer covers around an entire circumference of the second layer when viewed in a cross-section.

10. The device according to claim 1, wherein
    the first layer is continuously provided when viewed in a cross-section.

11. A semiconductor memory device, comprising:
a source layer including a first semiconductor layer;
a bit line provided above the source layer;
a plurality of word lines provided between the source layer and the bit line, the plurality of word lines being stacked in a first direction from the source layer to the bit line;
a second semiconductor layer extending in the first direction through the plurality of word lines and electrically connected to the source layer at a lower end and to the bit line at an upper end, the second semiconductor layer extending inside the first semiconductor layer and including a contact portion in contact with the first semiconductor layer;
a first film provided inside the first semiconductor layer, the first film having an upper surface, a lower surface and a side surface, the upper and lower surfaces being arranged in the first direction and being perpendicular to the first direction, the side surface being connected to the upper surface and the lower surface; and
a second film provided between the second semiconductor layer and the plurality of word lines, the second film electrically insulating the second semiconductor layer from the plurality of word lines,
the second film including a charge storage portion positioned between the second semiconductor layer and each of the plurality of word lines,
the first semiconductor layer including a first portion, a second portion, and a third portion, the first portion being provided on the upper surface of the first film, the second portion being provided on the lower surface of the first film, the third portion being provided on the side surface of the first film, the third portion being provided between the first film and the contact portion of the second semiconductor layer,
the first film including a first layer and a second layer, the first layer being provided between the second layer and the first semiconductor layer, the second layer being comprised of a material different from a material of the first layer, and
the first film being a metal film.

12. The device according to claim 11, wherein
the second film includes a third portion and a fourth portion, the third portion being provided between the second semiconductor layer and the plurality of word lines, the fourth portion being provided between the first semiconductor layer and a lower end of the second semiconductor layer, the fourth portion being apart from the third portion, and
the third portion of the first semiconductor layer surrounds the contact portion of the second semiconductor layer between the third portion of the second film and the fourth portion of the second film.

13. The device according to claim 12, further comprising a plurality of the second semiconductor layers, including the second semiconductor layer, extending into the first semiconductor layer, wherein
the plurality of second semiconductor layers each include the contact portion surrounded by the first semiconductor layer.

* * * * *